(12) United States Patent
Fukuhara et al.

(10) Patent No.: US 12,386,254 B2
(45) Date of Patent: Aug. 12, 2025

(54) TEMPLATE, METHOD FOR MANUFACTURING TEMPLATE, AND METHOD FOR MANUFACTURING SEMICONDUCTOR DEVICE

(71) Applicant: KIOXIA CORPORATION, Tokyo (JP)

(72) Inventors: Kazuya Fukuhara, Yokkaichi Mie (JP); Kazuhiro Takahata, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 288 days.

(21) Appl. No.: 17/898,052

(22) Filed: Aug. 29, 2022

(65) Prior Publication Data
US 2023/0305387 A1  Sep. 28, 2023

(30) Foreign Application Priority Data

Mar. 22, 2022  (JP) .................. 2022-046028

(51) Int. Cl.
| | |
|---|---|
| *G03F 7/00* | (2006.01) |
| *B29C 33/38* | (2006.01) |
| *G03F 7/20* | (2006.01) |
| *H01L 21/027* | (2006.01) |
| *H01L 21/311* | (2006.01) |
| *H01L 21/768* | (2006.01) |

(52) U.S. Cl.
CPC ........ *G03F 7/0002* (2013.01); *B29C 33/3842* (2013.01); *G03F 7/2012* (2013.01); *H01L 21/0271* (2013.01); *H01L 21/31144* (2013.01); *H01L 21/31116* (2013.01); *H01L 21/76807* (2013.01)

(58) Field of Classification Search
None
See application file for complete search history.

(56) References Cited

U.S. PATENT DOCUMENTS 7,148,142 B1 * 12/2006 Dakshina-Murthy ..................... H01L 21/76807
  438/669
2007/0187875 A1  8/2007 Terasaki et al.
2018/0264712 A1 * 9/2018 Asano .................. B29C 59/002
(Continued)

FOREIGN PATENT DOCUMENTS

| JP | 2007103915 A | 4/2007 |
| JP | 2013168604 A | 8/2013 |

(Continued)

*Primary Examiner* — Jiong-Ping Lu
(74) *Attorney, Agent, or Firm* — Kim & Stewart LLP

(57) ABSTRACT

According to one embodiment, a template includes a base material with a first surface at a first level. A first pattern on the template includes first protruding portions in a first region that protrude to a second level beyond the first level, a first recess portion between an adjacent pair of first protruding portions in a central portion of the first region, and a second recess portion between another adjacent pair of first protruding portions in an outer peripheral portion of the first region. A second pattern on the template includes a protrusion portion in a second region outside the first region. The protrusion portion protrudes to a third level. An optical layer is in the first recess portion and at least a portion of a bottom surface of the second recess portion is not covered by the optical layer.

20 Claims, 29 Drawing Sheets

(56) References Cited

U.S. PATENT DOCUMENTS

| | | | |
|---|---|---|---|
| 2021/0291408 A1* | 9/2021 | Motokawa | G03F 7/0002 |
| 2021/0302830 A1 | 9/2021 | Takai et al. | |

FOREIGN PATENT DOCUMENTS

| | | | |
|---|---|---|---|
| JP | 2018152515 A | 9/2018 |
| JP | 2019041126 A | 3/2019 |
| JP | 2021150629 A | 9/2021 |

\* cited by examiner

TEMPLATE, METHOD FOR MANUFACTURING TEMPLATE, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-046028, filed on Mar. 22, 2022, the entire contents of which are incorporated herein by reference.

FIELD

Embodiments described herein relate generally to a template, a method for manufacturing the template, and a method for manufacturing a semiconductor device related to imprint lithography techniques and the like.

BACKGROUND

In a method for manufacturing a semiconductor device, a technique in which a micro pattern is formed using nanoimprint lithography (NIL) is known.

DETAILED DESCRIPTION

Figure 1:
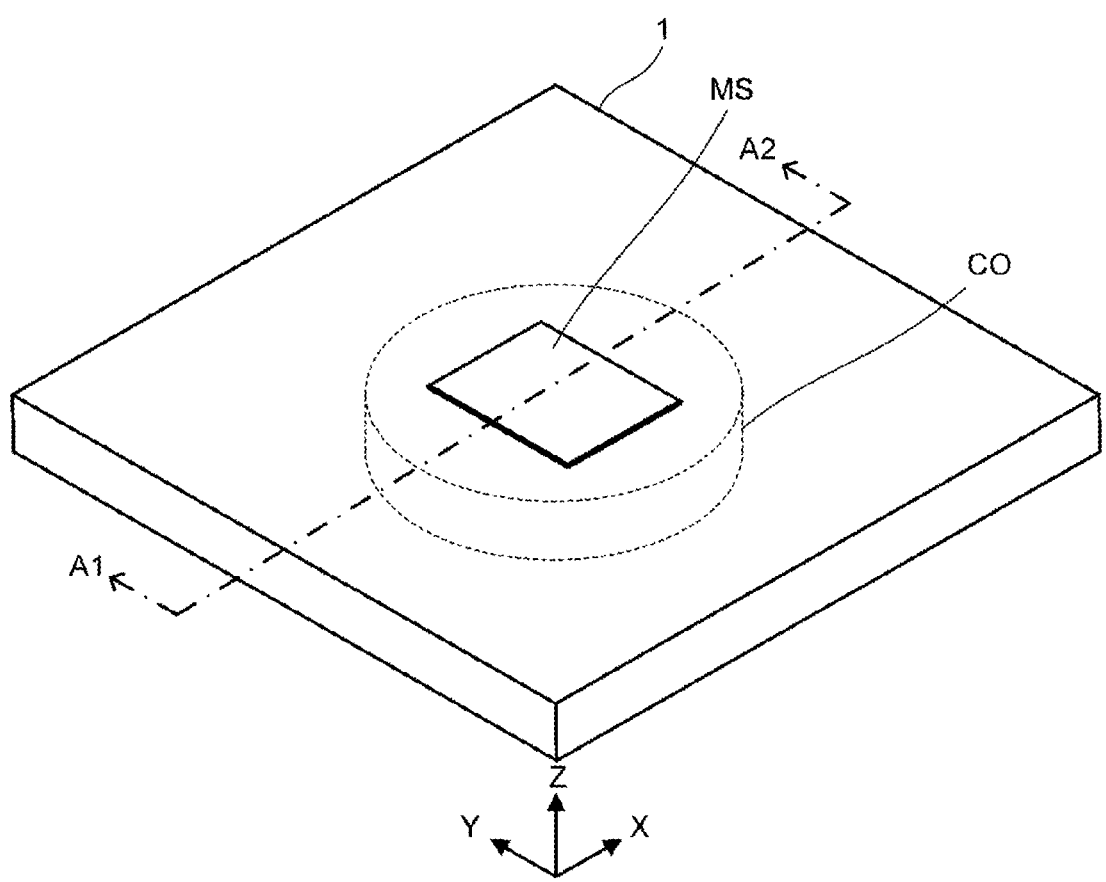
FIG. 1 is a schematic perspective view illustrating an example of a structure of a template.

Embodiments provide a template capable of forming an alignment mark for high-precision alignment.

In general, according to one embodiment, a template, includes a base material having a first surface at a first level. A first pattern is formed on the template and includes a plurality of first protruding portions on the first surface in a first region. The first protruding portion protrudes to a second level beyond the first level. A first recess portion of the first pattern is between an adjacent pair of first protruding portions in a central portion of the first region, and a second recess portion is between another adjacent pair of first protruding portions in an outer peripheral portion of the first region. A second pattern is formed on the template and includes a protrusion portion on the first surface in a second region outside the first region. The protrusion portion protrudes to a third level. An optical layer is in the first recess portion, and least a portion of a bottom surface of the second recess portion is not covered by the optical layer.

Hereinafter, certain example embodiments will be described with reference to drawings. In general, the depicted relationships between dimensions of each component in the drawings, the ratio in dimensions between components, and the number of components may be different from those of an actual product corresponding to the present disclosure. Furthermore, in the drawings, elements, components, and/or aspects that are substantially the same in different drawings are designated by the same reference numerals, and repeated description thereof may be omitted as appropriate.

First Embodiment (Example of Structure of Template)

Figure 2:
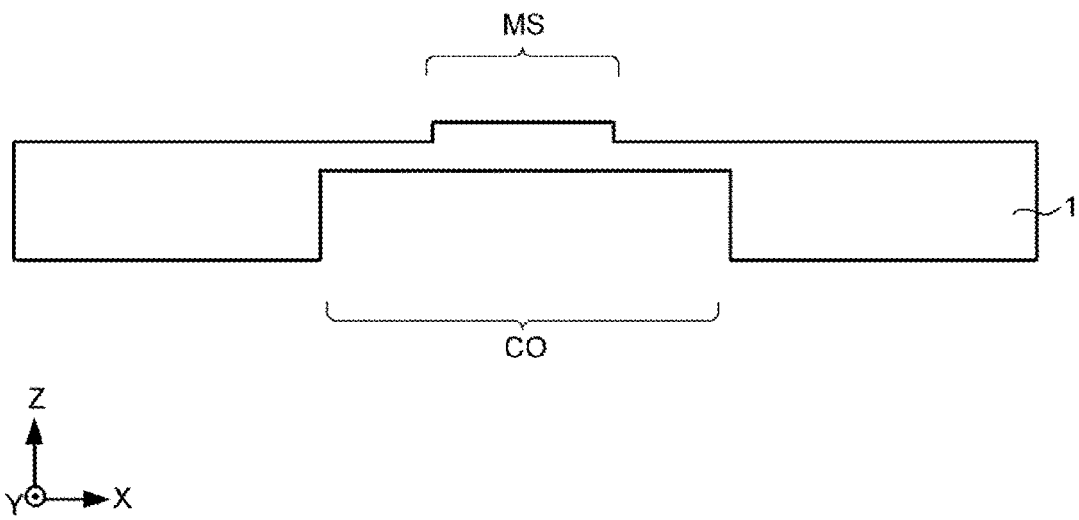
FIG. 2 is a schematic cross-sectional view illustrating an example of a structure of a template.
Figure 2:
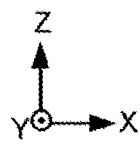

FIG. 1 is a schematic perspective view illustrating an example of a structure of a template. FIG. 2 is a schematic cross-sectional view illustrating the example of the structure of the template. FIGS. 1 and 2 illustrate an X-axis, a Y-axis orthogonal to the X-axis, and a Z-axis orthogonal to each of the X-axis and the Y-axis. FIG. 2 illustrates a part of a cross section along line A1-A2 illustrated in FIG. 1.

Figure 3:
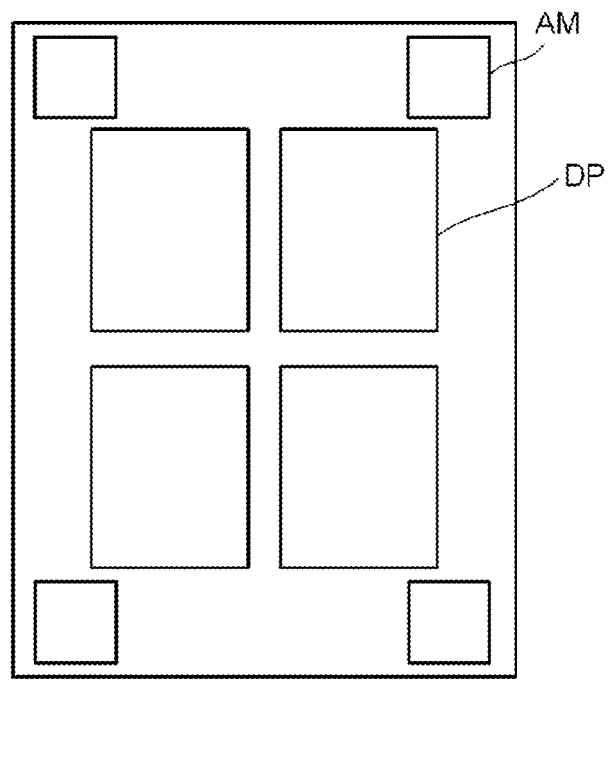
FIG. 3 is a schematic top view illustrating an example of a layout of a surface MS.
Figure 3:
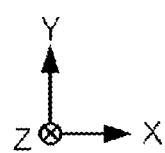

As illustrated in FIGS. 1 and 2, a template has a base material 1 including a surface MS (called a mesa) and a recess portion CO. FIG. 3 is a schematic top view illustrating an example of a layout on the surface MS, and illustrates a part of the X-Y plane of the base material 1. The surface MS includes an alignment mark pattern AM and a device pattern DP. The alignment mark pattern AM is a pattern that forms an alignment mark used in a pattern forming method using NIL. The device pattern DP is a pattern that forms a device pattern to be transferred by the pattern forming method using NIL. The number, the position, and the shape of the alignment mark pattern AM and the device pattern DP are not particularly limited.

Figure 4:
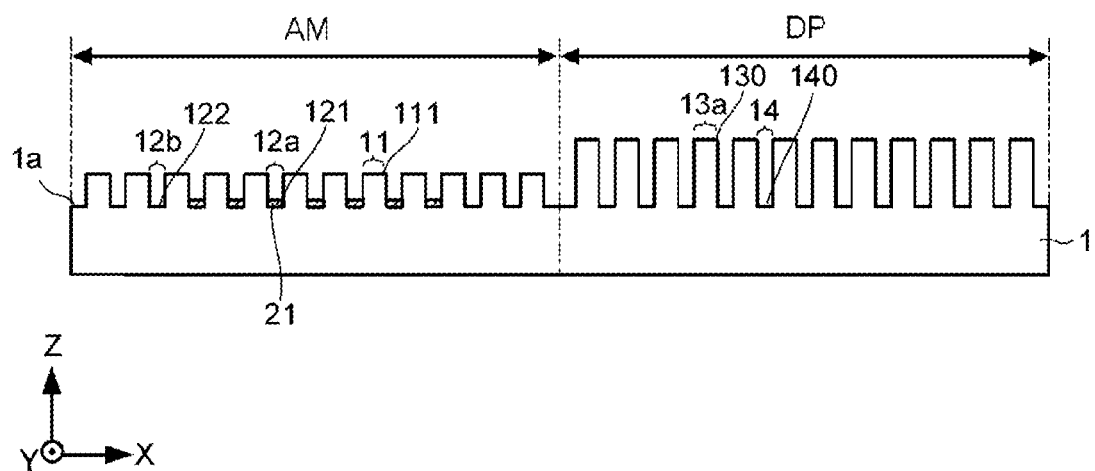
FIG. 4 is a schematic cross-sectional view illustrating an example of a template of a first embodiment.

FIG. 4 is a schematic cross-sectional view illustrating an example of a template of a first embodiment, and illustrates a part of the X-Z cross section of the template. As illustrated in FIG. 4, the example of the template of the first embodiment is provided with the base material 1 and an optical layer 21.

The base material 1 comprises a first material having a first optical constant (complex refractive index) with respect to light from an optical detector. The first material is, for example, quartz. The light from the optical detector may penetrate the base material 1.

The base material 1 has a surface 1a and regions for the alignment mark pattern AM and the device pattern DP. For convenience, FIG. 4 schematically illustrates the alignment mark pattern AM and the device pattern DP to be directly adjacent to each other. However, the actual template is not limited to such a layout.

In the pattern forming method using NIL, a mold (the template) is pressed onto an imprint material layer such as an ultraviolet curable resin provided on an object, light is irradiated to cure the layer containing the imprint material, and the device pattern DP is transferred to the imprint material layer from the mold. The object is, for example, an insulating layer formed above a semiconductor device or a silicon wafer.

The alignment mark pattern AM includes at least one protrusion portion 11, at least one recess portion 12a, and at least one recess portion 12b provided adjacent or proximate to the recess portion 12a. As an example, FIG. 4 illustrates the alignment mark pattern AM including a plurality of protrusion portions 11, a plurality of recess portions 12a, and a plurality of recess portions 12b. In this context, "recess portions" refer to the height difference formed relative to the upper surface 111 of the protrusion portions 11. Here, the recess portions 12a/12b may be considered grooves, trenches, or the like formed in the upper surface 111.

The device pattern DP includes at least one protrusion portion 13a and at least one recess portion 14. As an example, FIG. 4 illustrates a device pattern DP having a line-and-space pattern including a plurality of protrusion portions 13a and a plurality of recess portions 14. In this context, "recess portions" refer to the height difference formed relative to the upper surface 130 of the protrusion portions 13a.

The protrusion portion 11 and the recess portion 12a are alternately provided, for example, in the X-axis direction. FIG. 4 illustrates an example in which the upper surface 130 is higher than the upper surface 111 with respect to the surface 1a. However, the present disclosure is not limited thereto, and the upper surface 111 of the and the upper surface 130 may have the same height in other examples.

The recess portion 12b is provided adjacent to the recess portion 12a when viewed in a top view of the base material 1. The protrusion portion 11 and the recess portion 12b are alternately provided, for example, in the X-axis direction.

FIG. 4 illustrates the example in which the depth of the recess portion 12a from the upper surface 111 is the same as the depth of the recess portion 12b from the upper surface 111. However, the present disclosure is not limited thereto, and the depth of the recess portion 12a may be different from the depth of the recess portion 12b.

FIG. 4 illustrates the example in which the recessed depth of the recess portion 12a from the upper surface 111 is less than the recessed depth of the recess portion 14 from the upper surface 130, though the bottoms of the recess portions 12 and 14 are depicted as being at the same level as one another. However, the present disclosure is not limited thereto, and the recessed depth of the recess portion 12a from the upper surface 111 may instead be the same as or greater than the depth of the recess portion 14 from the upper surface 130.

The optical layer 21 comprises a second material having a second optical constant (refractive index), which is different from the first optical constant (refractive index), with respect to light from an optical detector. The second material may be, for example, chromium. The present disclosure is not limited thereto, and the second material may, for example, comprise at least one material selected from a group consisting of titanium, tantalum, tungsten, chromium, copper, silicon carbide, and silicon fluoride. The optical layer 21 may form, for example, a light-shielding layer that reflects or blocks the light from an optical detector. Since imaging contrast may be improved between the recess portions 12a and other regions by providing the optical layer 21, the alignment mark pattern AM may be more easily detected using an optical detector. Therefore, the precision of the alignment between the template and the object may be increased.

The optical layer 21 is provided in the recess portion 12a, but not provided in the recess portion 12b. That is, while a bottom surface 121 of the recess portion 12a is in contact with (e.g., covered by) the optical layer 21, the bottom surface 122 of the recess portion 12b is not covered by the optical layer 21. The bottom surface 122 may be referred to as an exposed or uncovered surface. The thickness of the optical layer 21 may be smaller than the depth of the recess portion 12a. The optical layer 21 may be in contact with only a part of the bottom surface 121 of some or all recess portions 12a.

Figure 5:
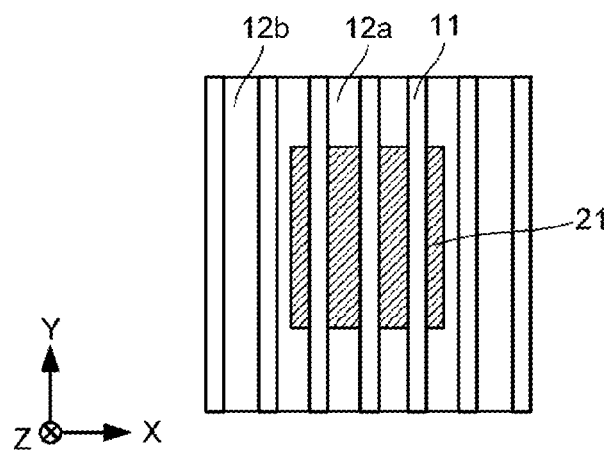
FIG. 5 is a schematic top view illustrating an example of a shape of an alignment mark pattern AM.
Figure 6:
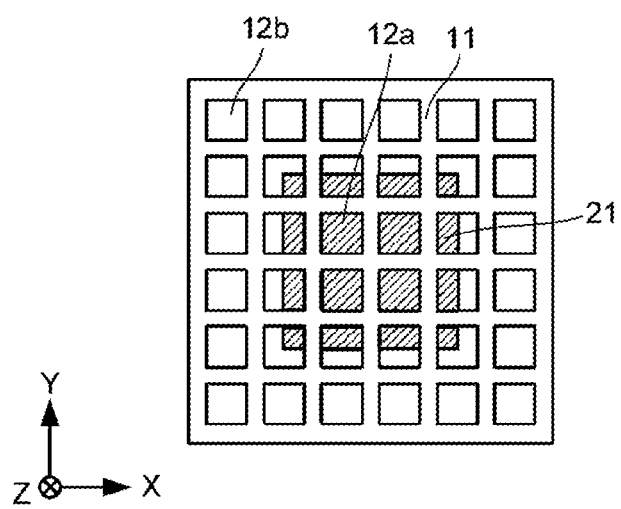
FIG. 6 is a schematic top view illustrating an example of a shape of an alignment mark pattern AM.
Figure 7:
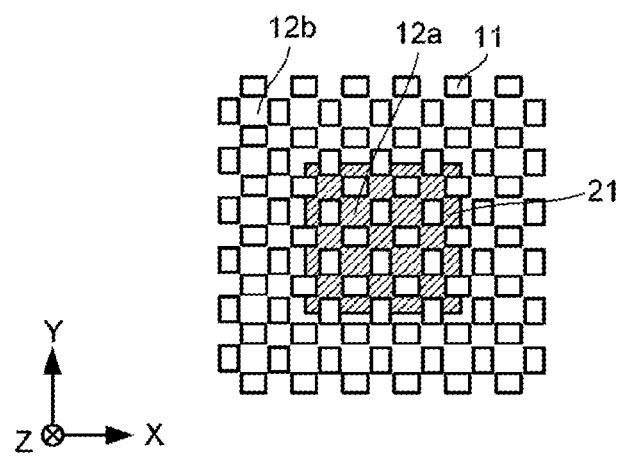
FIG. 7 is a schematic top view illustrating another example of a shape of an alignment mark pattern AM.

FIGS. 5, 6, and 7 are schematic top views illustrating examples of a shape of the alignment mark pattern AM, and illustrate the protrusion portions 11, the recess portions 12a (in which the optical layer 21 is formed), and the recess portions 12b (in which the optical layer 21 is not formed). The alignment mark pattern AM illustrated in FIG. 5 includes the protrusion portion 11 disposed in a stripe shape with recess portions 12a or recess portions 12b between each pair of protrusion portions 11. The recess portions 12a are sandwiched between a pair of recess portions 12b disposed on the X-axis ends.

The alignment mark pattern AM illustrated in FIG. 6 includes a protrusion portion 11 disposed in a grid shape with recess portions 12a and recess portions 12b being isolated between portions of the grid pattern. The recess portions 12a and 12b may be said to have "a dot shape" in this context. A plurality of dot-shaped recess portions 12b surround the plurality of dot-shaped recess portions 12a.

The alignment mark pattern AM illustrated in FIG. 7 includes a plurality of protrusion portions 11 disposed in an array shape, a plurality of recess portions 12a, and a plurality of recess portions 12b provided around the plurality of recess portions 12a. On the upper surface of the base material 1, the area of the recess portion 12b can be appropriately set according to the precision of the alignment of the mask during the forming (patterning) of the optical layer 21.

(Example of Method for Manufacturing Template)

FIGS. 8 to 21 are schematic cross-sectional views illustrating an example of a method for manufacturing the template of the first embodiment, and illustrate a part of the X-Z cross section of the base material 1. The example of the method for manufacturing the template will be described by schematically illustrating a region R1 of the base material 1 in which the alignment mark pattern AM is ultimately formed and a region R2 of the base material 1 in which the device pattern DP is ultimately formed. Each of the region R1 and the region R2 illustrated in FIGS. 8 to 21 can be considered a portion of the surface 1a.

Figure 8:
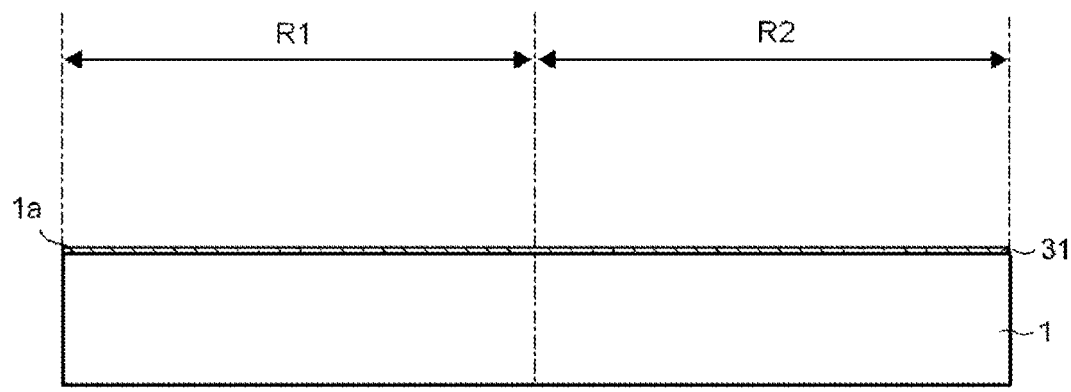
FIGS. 8 to 21 are schematic cross-sectional views illustrating aspects of a method for manufacturing a template of a first embodiment.
Figure 9:
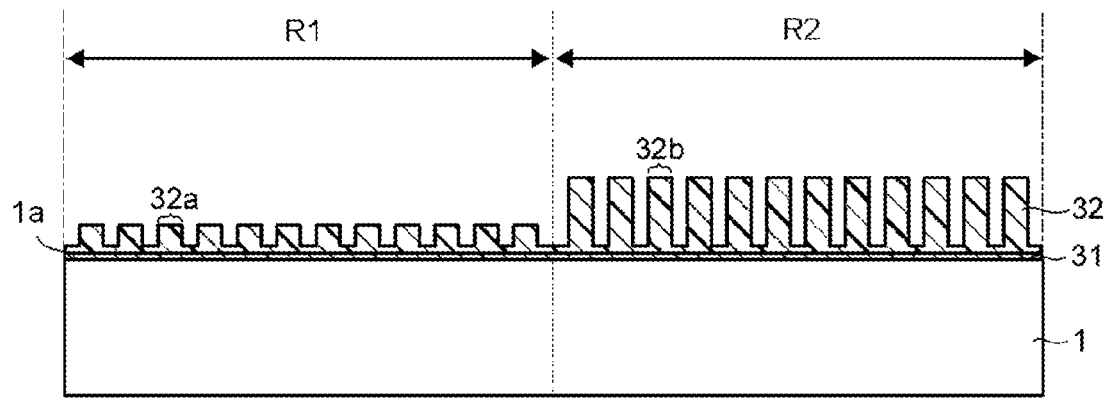

First, as illustrated in FIG. 8, a hard mask layer 31 is formed on the surface 1a, and subsequently, as illustrated in FIG. 9, a resist mask layer 32 is formed on the hard mask layer 31.

The hard mask layer 31 functions as a hard mask for processing the base material 1. The hard mask layer 31 contains, for example, chromium. The hard mask layer 31 may be formed by using, for example, sputtering or an atomic layer deposition method (ALD).

The resist mask layer 32 functions as a resist mask for processing the hard mask layer 31. The resist mask layer 32 includes a protrusion portion 32a provided in the region R1 and a protrusion portion 32b provided in the region R2. The protrusion portion 32a and the protrusion portion 32b cover portions where the hard mask layer 31 will be left. The protrusion portion 32b has a greater height above the surface 1a than the protrusion portion 32a. The resist mask layer 32 is formed, for example, by using a pattern forming method using NIL.

Figure 10:
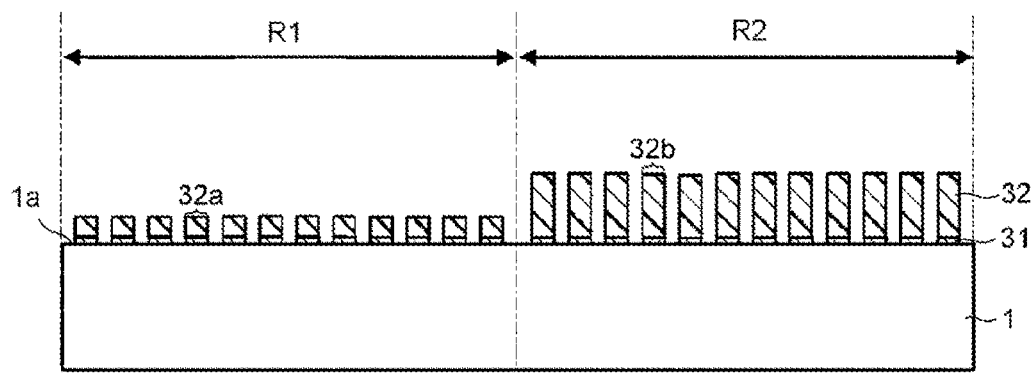

Subsequently, a part of the resist mask layer 32 is removed in the thickness direction to expose a part of the hard mask layer 31, and as illustrated in FIG. 10, the exposed portion of the hard mask layer 31 is removed (etched). The resist mask layer 32 is processed such that each of the protrusion portion 32a and the protrusion portion 32b partially remains after this removal of the exposed hard mask layer. The resist mask layer 32 may be partially removed, for example, during reactive ion etching (RIE). The hard mask layer 31 may be selectively removed, for example, by dry etching. The dry etching that processes the hard mask layer 31 is, for example, inductively coupled plasma (ICP)-reactive ion etching (RIE) using a mixed gas of chlorine ($Cl_2$) gas and oxygen ($O_2$) gas.

Figure 11:
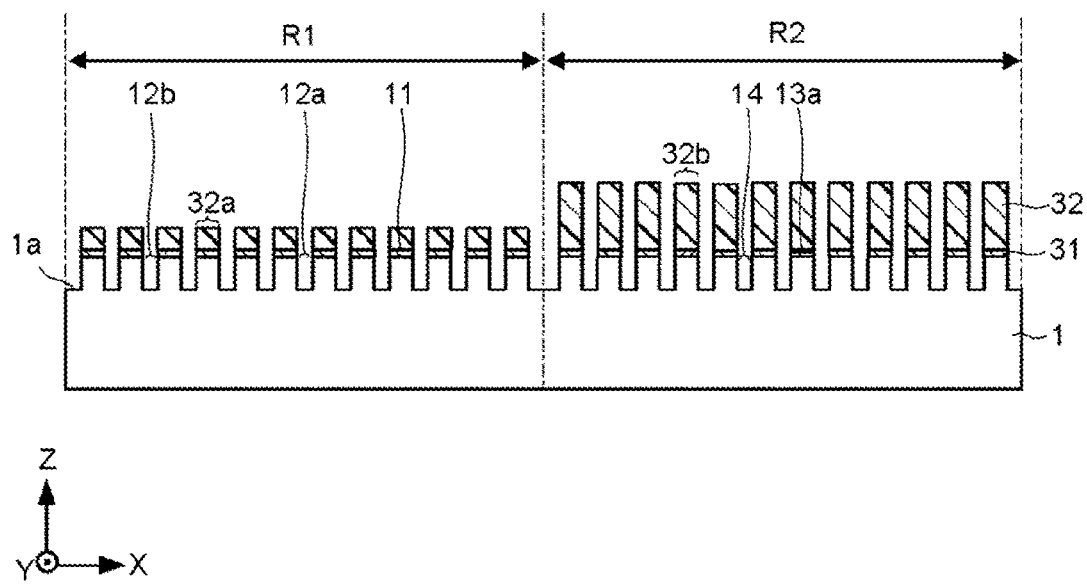

Subsequently, as illustrated in FIG. 11, a part of the base material 1 is removed in the thickness direction by etching using the combination of the hard mask layer 31 and the resist mask layer 32 as a mask, and thus the protrusion portion 11, the recess portion 12a, and the recess portion 12b are formed in the region R1, and the protrusion portion 13a and the recess portion 14 are formed in the region R2. The base material 1 is processed, for example, by being partially removed from the surface 1a side in the thickness direction, for example, by anisotropic etching such as dry etching. The dry etching that processes the base material 1 is, for example, inductively coupled plasma-reactive ion etching using trifluoromethane ($CHF_3$) gas.

Figure 12:
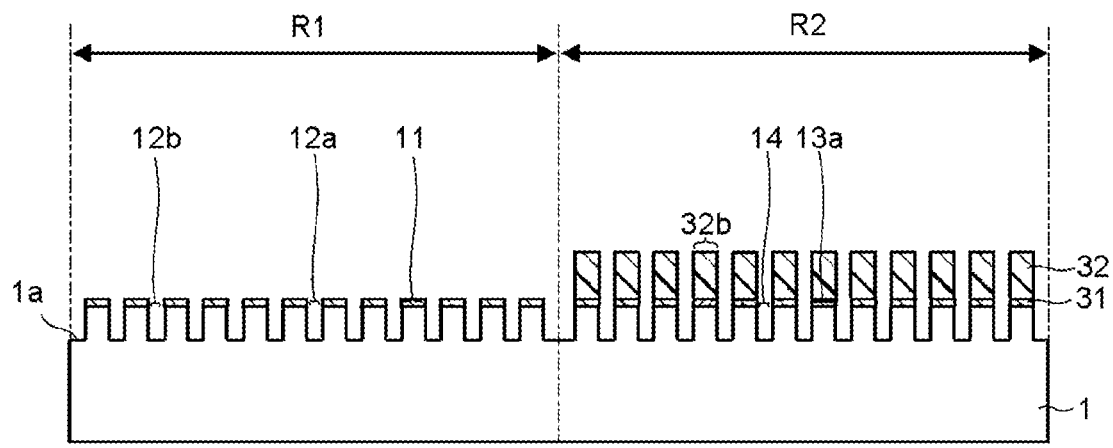

Subsequently, as illustrated in FIG. 12, a part of the resist mask layer 32 is removed to expose a part of the hard mask layer 31. The resist mask layer 32 is processed such that the protrusion portion 32a is removed while the protrusion portion 32b still partially remains.

Figure 13:
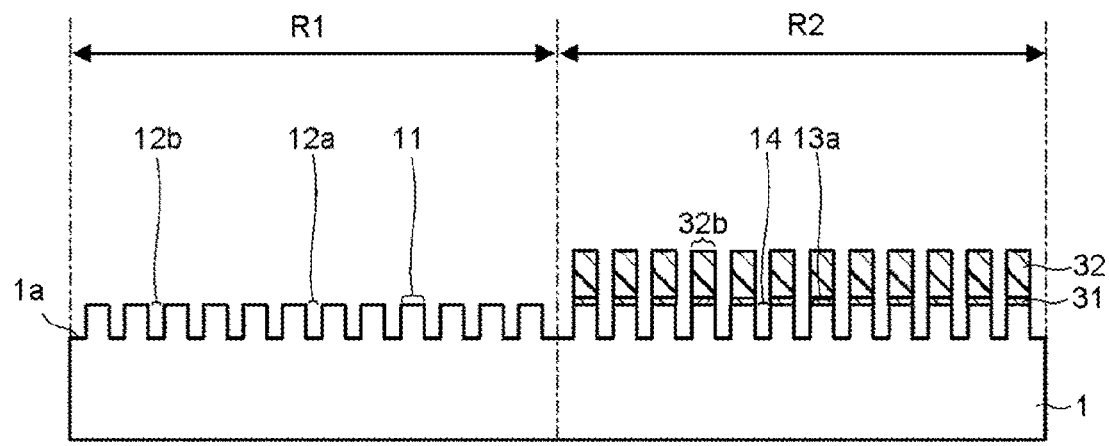

Subsequently, as illustrated in FIG. 13, the newly exposed portions of the hard mask layer 31 are removed by etching using the remaining resist mask layer 32 in region R2 as a mask so that the still unexposed portions of the hard mask layer 31 in region R2 remain.

Figure 14:
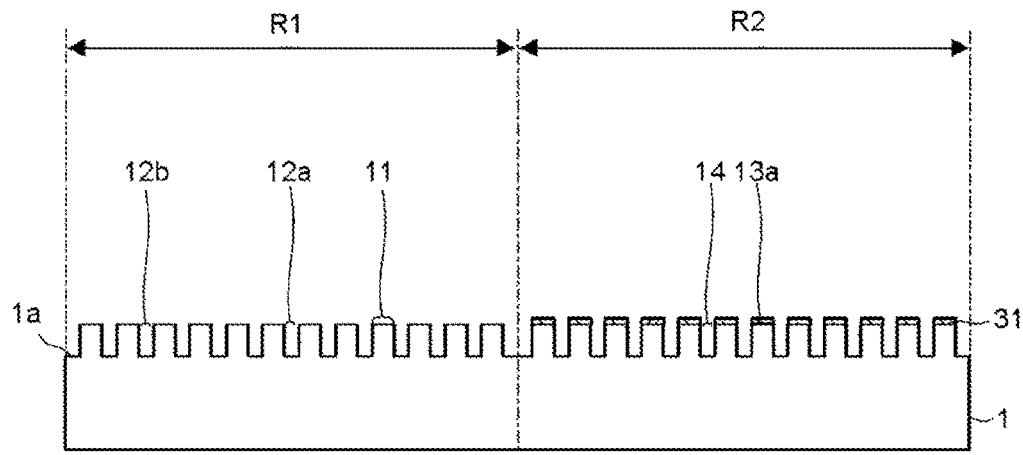
Figure 14:
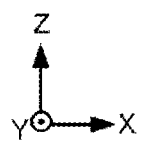
Figure 15:
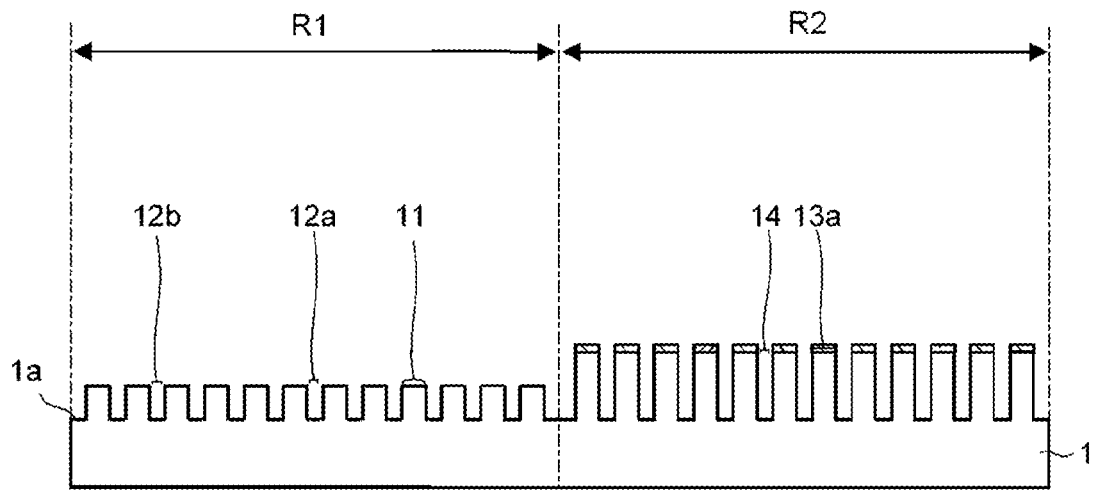
Figure 15:
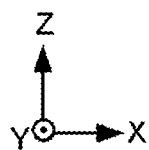

Subsequently, as illustrate in FIG. 14, the remaining resist mask layer 32 is removed. Thereafter, as illustrated in FIG. 15, the base material 1 is etched using the hard mask layer 31 as a mask. Therefore, since the protrusion portion 13a is protected, the protrusion portion 11, the recess portion 12a, the recess portion 12b, and the recess portion 14 are removed (etched) in the thickness direction.

Figure 16:
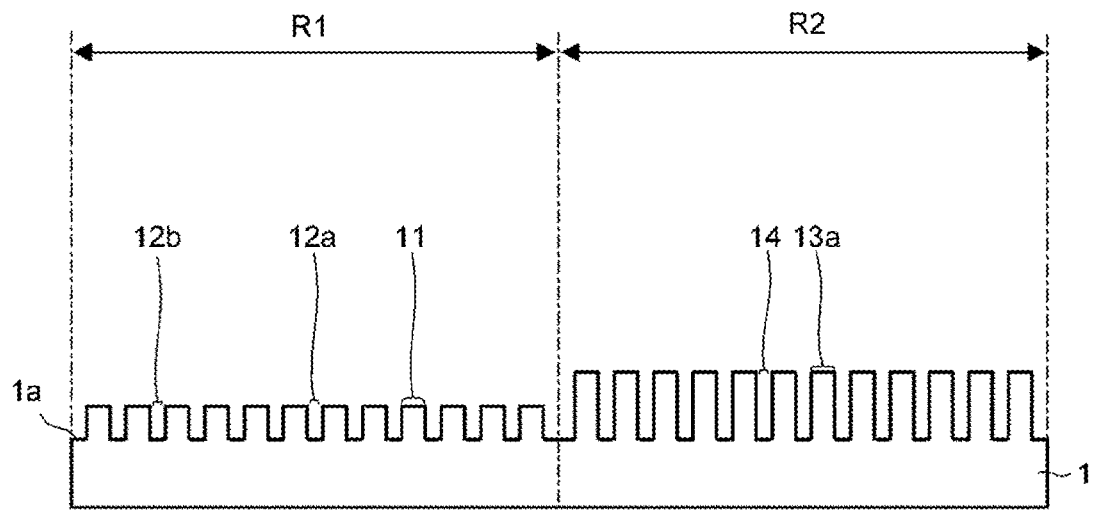
Figure 16:
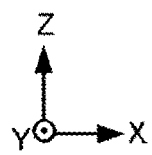
Figure 17:
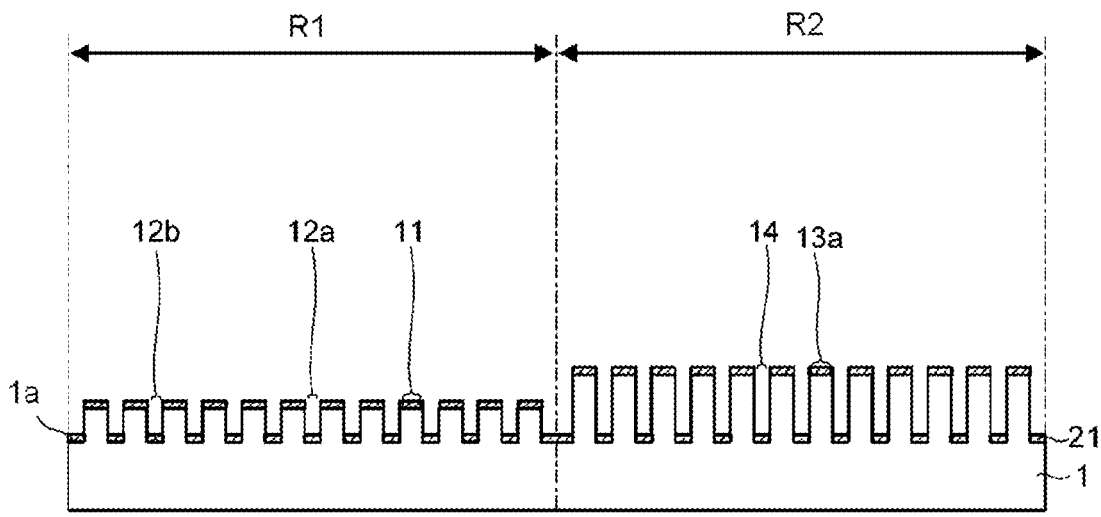
Figure 17:
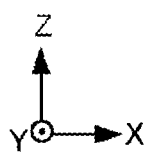

Subsequently, as illustrated in FIG. 16, the still remaining hard mask layer 31 is removed. Thereafter, as illustrated in FIG. 17, an optical layer 21 that covers the surface 1a, the protrusion portion 11, the recess portion 12a, the recess portion 12b, the protrusion portion 13a, and the recess portion 14 is formed. The optical layer 21 is formed by depositing a material that can be used as the optical layer 21 over the entire surface 1a, for example, by reactive sputtering.

Figure 18:
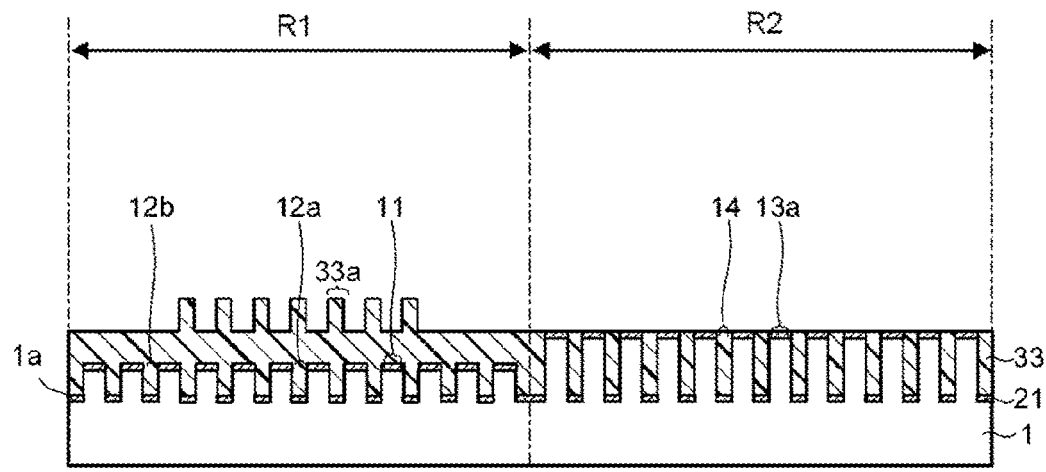

Subsequently, as illustrated in FIG. 18, a resist mask layer 33 is formed on the optical layer 21. The resist mask layer 33 functions as a resist mask for processing (patterning) the material for the optical layer 21. The resist mask layer 33 includes a protrusion portion 33a provided above the recess portion 12a. The protrusion portion 33a is provided where the optical layer 21 will be left after processing. The resist mask layer 33 is formed, for example, by using a pattern forming method using NIL.

Figure 19:
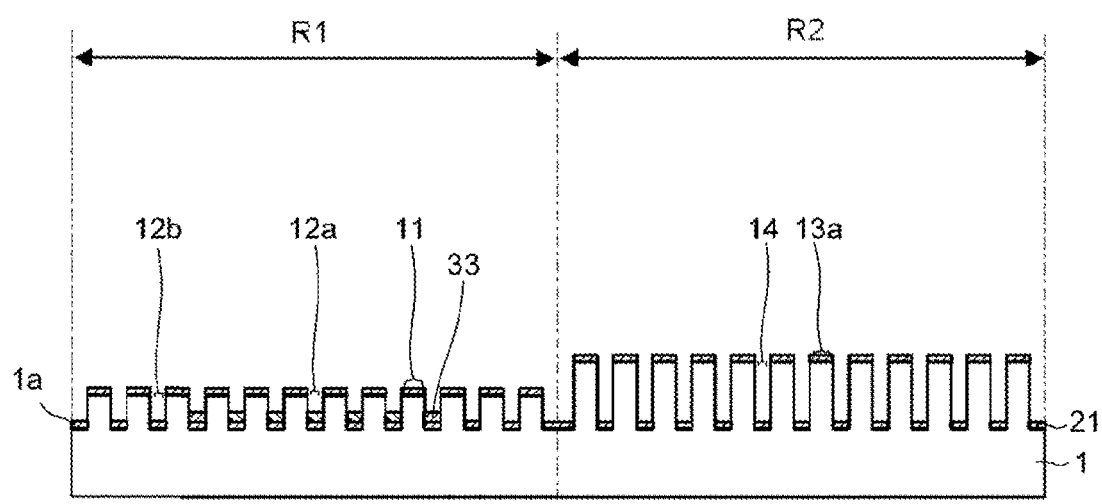

Subsequently, as illustrated in FIG. 19, a part of the resist mask layer 33 is removed in the thickness direction to expose a part of the optical layer 21 while leaving the resist mask layer 33 in the recess portion 12a. The resist mask layer 33 may be partially removed, for example, by reactive ion etching.

Figure 20:
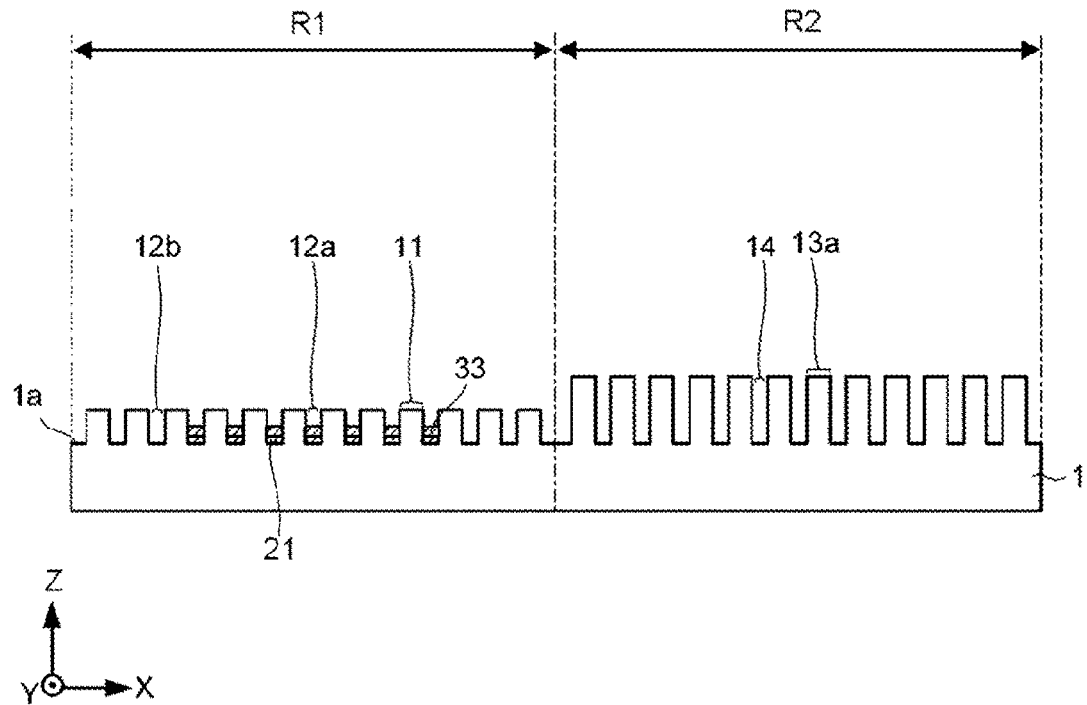

Subsequently, as illustrated in FIG. 20, the exposed portion of the optical layer 21 is removed by etching using the remaining resist mask layer 33 as a mask, with the recess portion 12b, the protrusion portion 13a, and the recess portion 14 left exposed (uncovered by resist mask layer 33).

Figure 21:
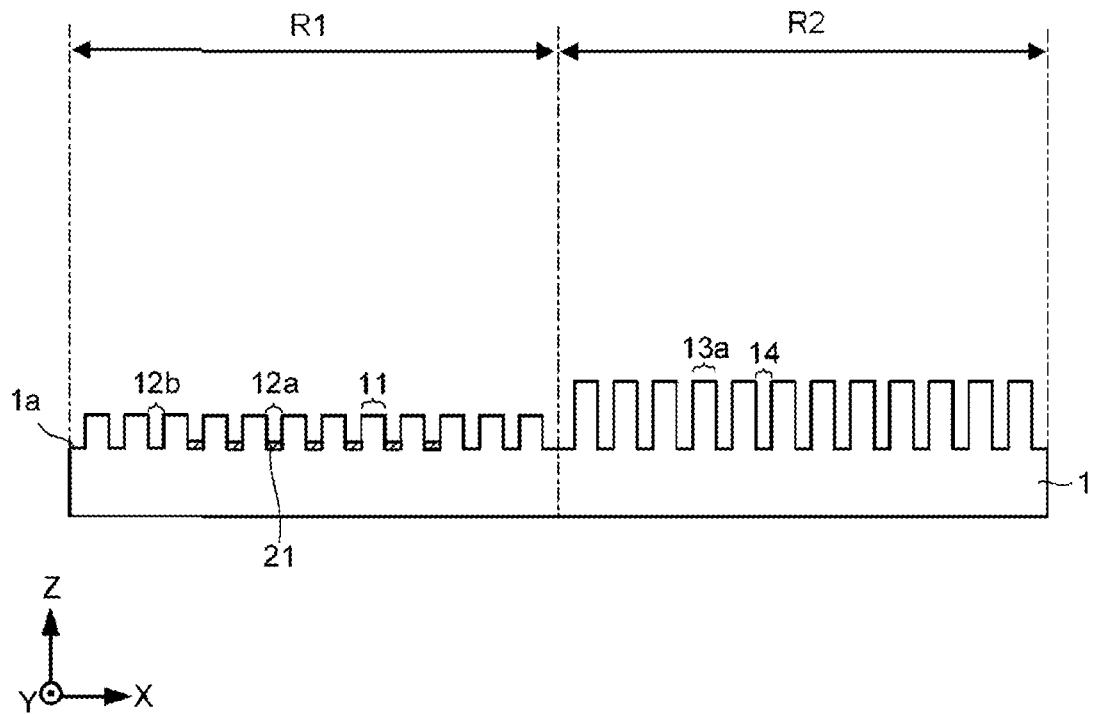

Subsequently, as illustrated in FIG. 21, the remaining resist mask layer 33 is removed. The above is the description of an example of a method for manufacturing the template of the first embodiment.

In general, when the optical layer 21 is formed as described above, the alignment precision in the formation of the protrusion portion 33a with respect to the base material 1 is low. If the formation position of the optical layer 21 is displaced from an intended/desired position, then an optical pattern having a larger area than intended for the optical layer 21 formed in the recess portions 12a may be formed at the edge portion of the alignment mark pattern AM. In this case, when the alignment mark pattern AM is being detected using light from an optical detector, the unintended pattern portion spreading at the edge portion of the alignment mark pattern AM could cause stray light to shine brightly, which causes the alignment precision in the use of the template for subsequent pattern transfer processes to be deteriorated.

Figure 22:
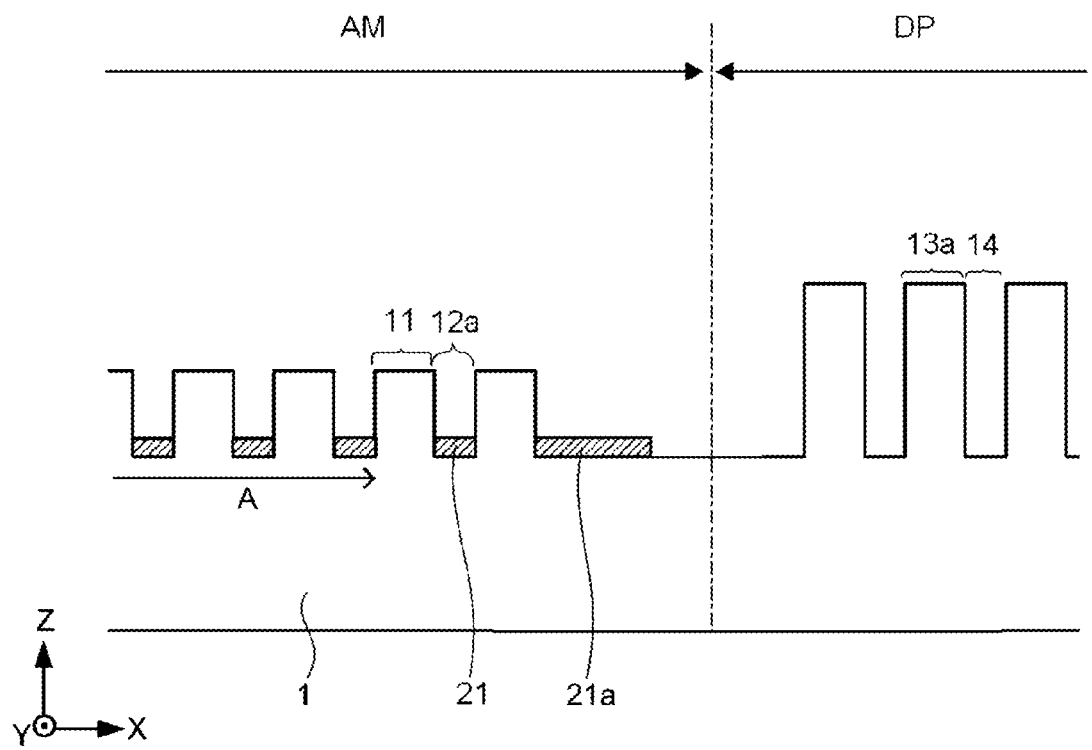
FIG. 22 is a schematic cross-sectional view illustrating a comparative example with a displaced optical layer in a peripheral region.
Figure 23:
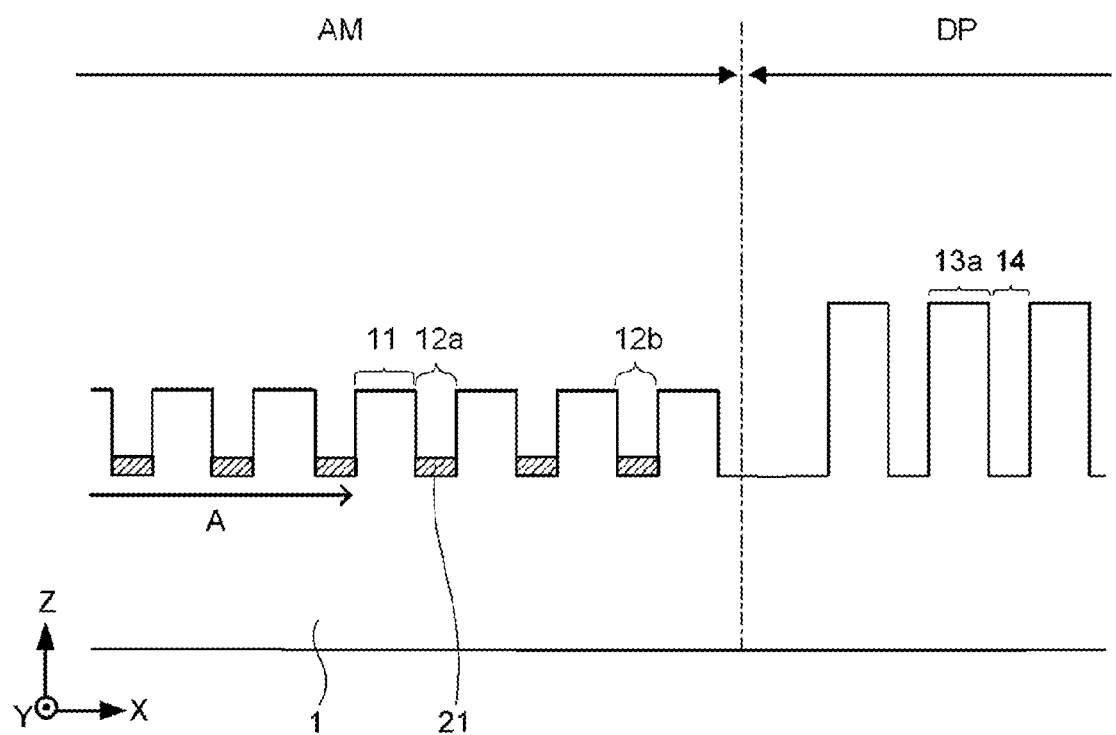
FIG. 23 is a schematic cross-sectional view illustrating an embodiment example of with a displaced optical layer in a peripheral region.

FIGS. 22 and 23 are schematic cross-sectional views illustrating examples of formation of the optical layer 21 at the end portion of the alignment mark pattern AM. If the recess portion 12b is not formed (as illustrated in a comparative example in FIG. 22), when the position of the pattern of the optical layer 21 is displaced from its intended position, for example, in an arrow A direction along the X-axis, as illustrated in FIG. 22, an optical pattern portion 21a having a larger area than the optical layer 21 formed in the recess portion 12a can be formed at the edge portion of the alignment mark pattern AM.

In contrast, in the template and the method of manufacturing the template of the first embodiment, the recess portion 12b in which the optical layer 21 is not intended to be formed is provided. In this case, as illustrated in FIG. 23, even when the pattern of the optical layer 21 is displaced from its intended position and thus is optical layer 21 is formed outside of the recess portions 12a, the displaced portion of the optical pattern (optical layer 21) will be formed in a recessed portion 12b. The recess portions 12b are similarly sized to the recess portions 12a in this example, thus an optical pattern portion 21a or the like having a large area is prevented from being formed at the edge portion of the alignment mark pattern AM. Therefore, an alignment mark capable of high-precision alignment for subsequent pattern transfer processes using the template may be formed.

The above embodiment may be appropriately combined with other described embodiments.

Second Embodiment (Example of Structure of Template)

Similarly to the template of the first embodiment, a template of a second embodiment is provided with the base material 1 including the surface MS, and the recess portion CO. The surface MS includes the alignment mark pattern AM and the device pattern DP.

Figure 24:
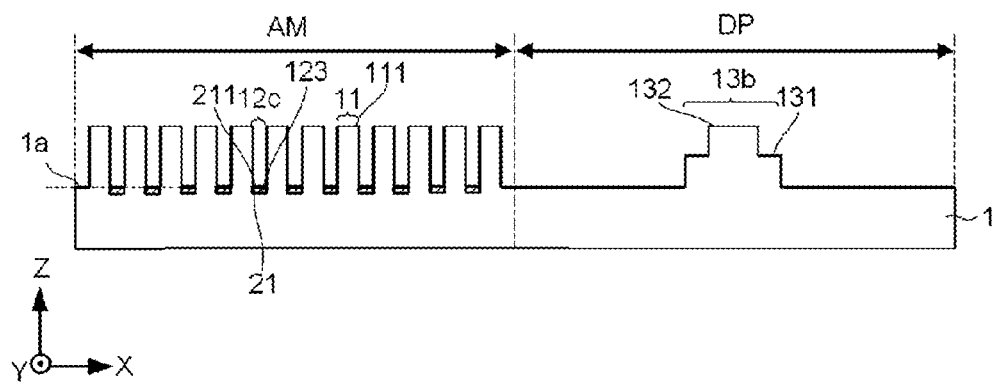
FIG. 24 is a schematic cross-sectional view illustrating an example of a template of a second embodiment.

FIG. 24 is a schematic cross-sectional view illustrating an example of the template of the second embodiment, and illustrates a part of the X-Z cross section of the template. Similarly to the first embodiment, the template of the second embodiment is provided with the base material 1 and the optical layer 21 thereon.

The alignment mark pattern AM includes at least one protrusion portion 11 and at least one recess portion 12c. As an example, FIG. 24 illustrates the alignment mark pattern AM including a plurality of protrusion portions 11 and a plurality of recess portions 12c.

The protrusion portion 11 and the recess portion 12c are alternately formed, for example, in the X-axis direction. For example, the layouts of the recess portion 12a illustrated in FIGS. 5, 6, and 7 may be taken as an upper surface layout of the recess portion 12c.

The device pattern DP includes a protrusion portion 13b. The protrusion portion 13b includes a convex-shaped region 131, and a convex-shaped region 132 protruding from the convex-shaped region 131. FIG. 24 illustrates the device pattern DP including one protrusion portion 13b for forming a dual damascene structure as an example. In FIG. 24, the height of the protrusion portion 11 from the surface 1a is equal to the height of the convex-shaped region 132 of the protrusion portion 13b from the surface 1a.

A bottom surface 123 of the recess portion 12c is provided at a position deeper than the surface 1a.

Figure 25:
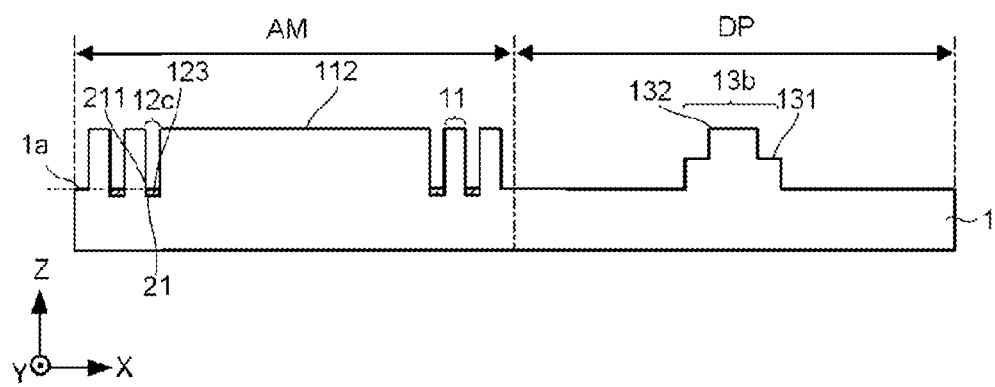
FIG. 25 is a schematic cross-sectional view illustrating another example of a template of a second embodiment.

As illustrated in FIG. 25, the alignment mark pattern AM may include at least one protrusion portion 112 between pluralities of recess portions 12c. FIG. 25 is a schematic cross-sectional view illustrating another example of the template of the second embodiment, and illustrates a part of the X-Z cross section of the template.

The protrusion portion 112 is a light transmitting region that forms an alignment mark. The width of the protrusion portion 112 in the X-axis direction may be wider than the width of the protrusion portion 11 in the X-axis direction.

The optical layer 21 is provided in the recess portions 12c. The bottom surface 123 of the recess portion 12c is in contact with the optical layer 21. The thickness of the optical layer 21 may be less than the depth of the recess portion 12c.

Figure 26:
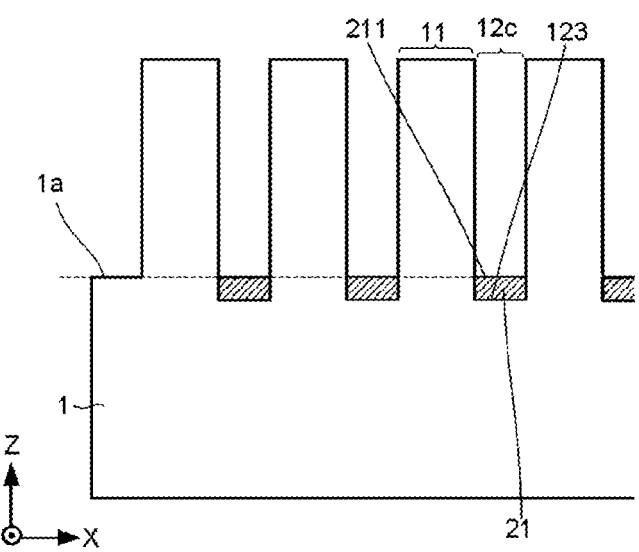
FIG. 26 is an enlarged view of a part of FIG. 24.

As illustrated in FIG. 26, an upper surface 211 of the optical layer 21 may be substantially level with the level of surface 1a. FIG. 26 is an enlarged view of a part of FIG. 24. In the present specification, the expression that the upper surface 211 and the surface 1a are substantially level with each other means that the difference in height between the upper surface 211 and the surface 1a is within ±5 nm.

Similarly to the first embodiment, the optical layer 21 contains a second material having a second optical constant, which is different from the first optical constant, with respect to light from an optical detector.

Figure 27:
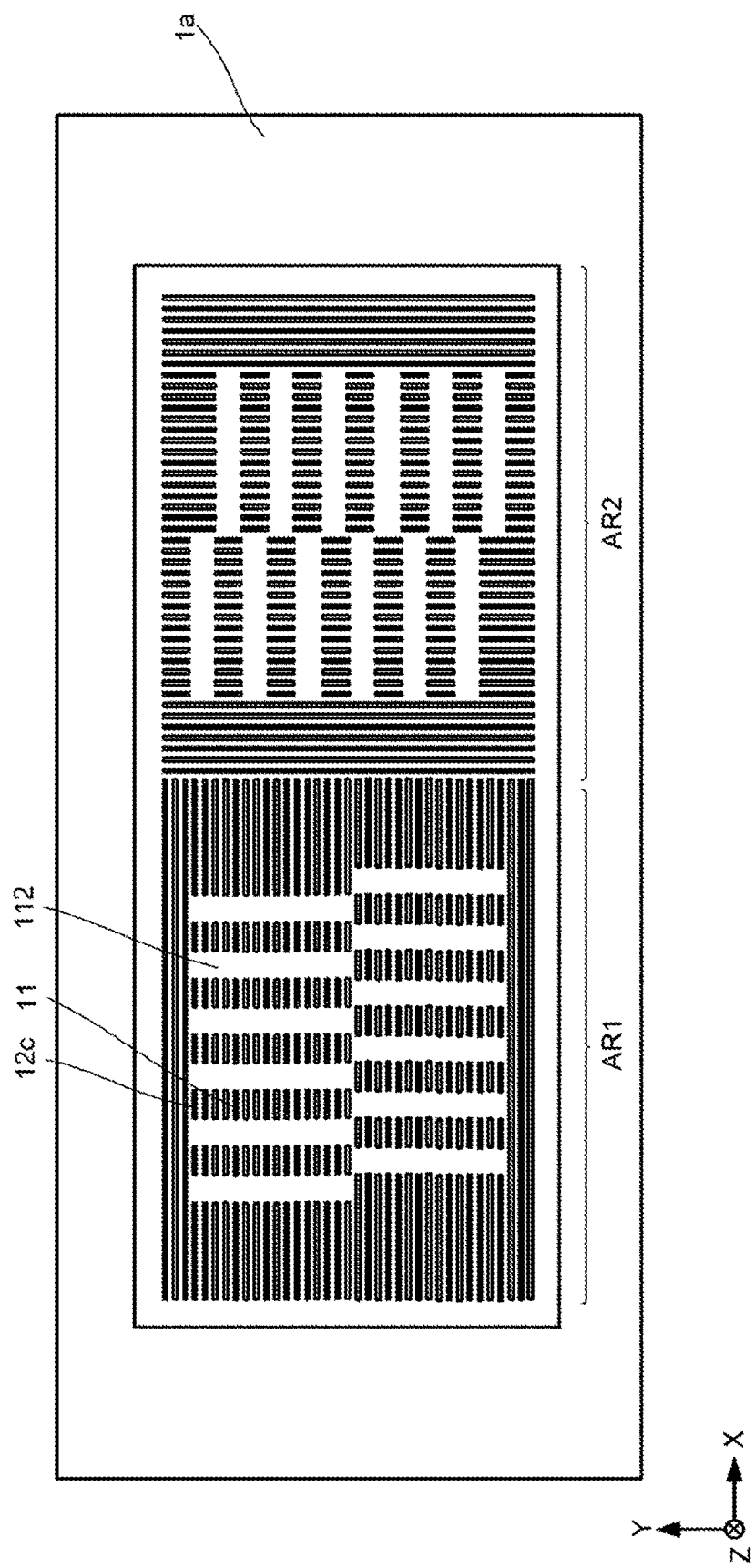
FIG. 27 is a schematic top view illustrating an example of a shape of an alignment mark pattern AM.

FIG. 27 is a schematic top view illustrating an example of a shape of the alignment mark pattern AM. The alignment mark pattern AM illustrated in FIG. 27 includes an alignment mark pattern region AR1 and an alignment mark pattern region AR2. Each of the alignment mark pattern region AR1 and the alignment mark pattern region AR2 includes protrusion portions 112 surrounded by a plurality of recess portions 12c. In the alignment mark pattern region AR1 and the alignment mark pattern region AR2, the extending direction of the recess portion 12c is different from each other. The recess portion 12c in the alignment mark pattern region AR1 extends, for example, in the X-axis direction, and the recess portion 12c in the alignment mark pattern region AR2 extends, for example, in the Y-axis direction.

(Example of Method for Manufacturing Template)

FIGS. 28 to 45 are schematic cross-sectional views illustrating an example of a method for manufacturing the template of the second embodiment, and illustrate a part of the X-Z cross section of the base material 1. The example of the method for manufacturing the template will be described by schematically illustrating the region R1 of the base material 1 in which the alignment mark pattern AM is formed and the region R2 of the base material 1 in which the device pattern DP is formed. Each of the region R1 and the region R2 illustrated in FIGS. 28 to 45 can be considered a portion of the surface 1a.

Figure 28:
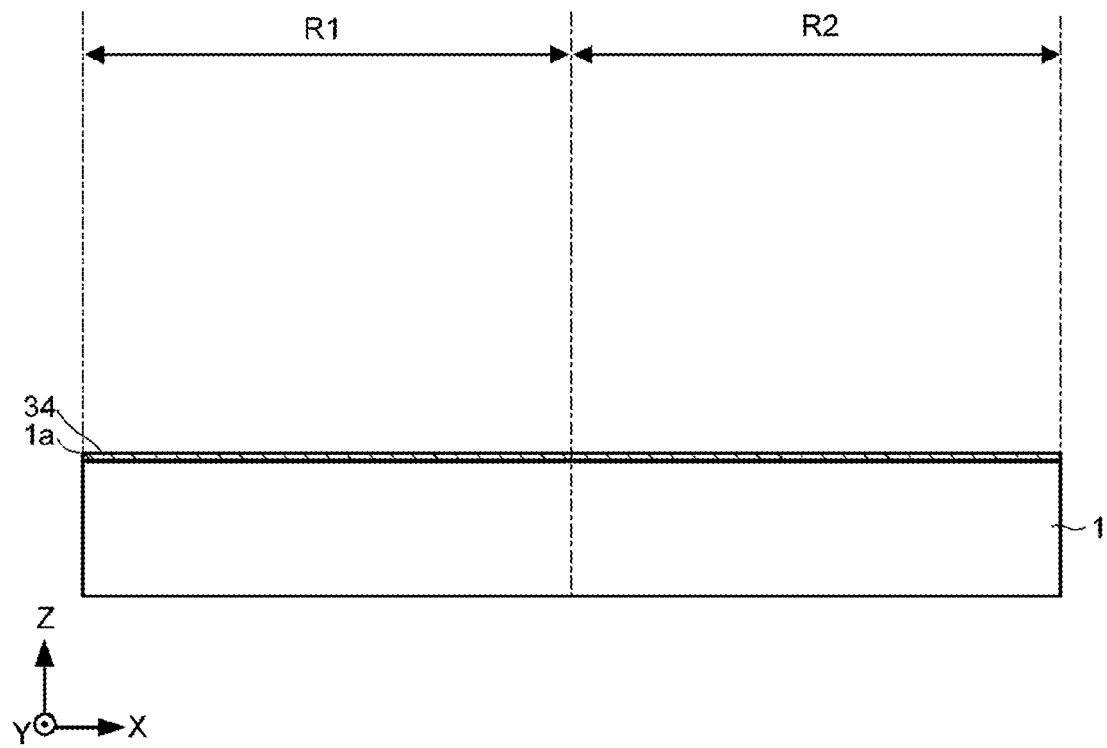
FIGS. 28 to 45 are schematic cross-sectional views illustrating aspects of a method for manufacturing a template of a second embodiment.
Figure 29:
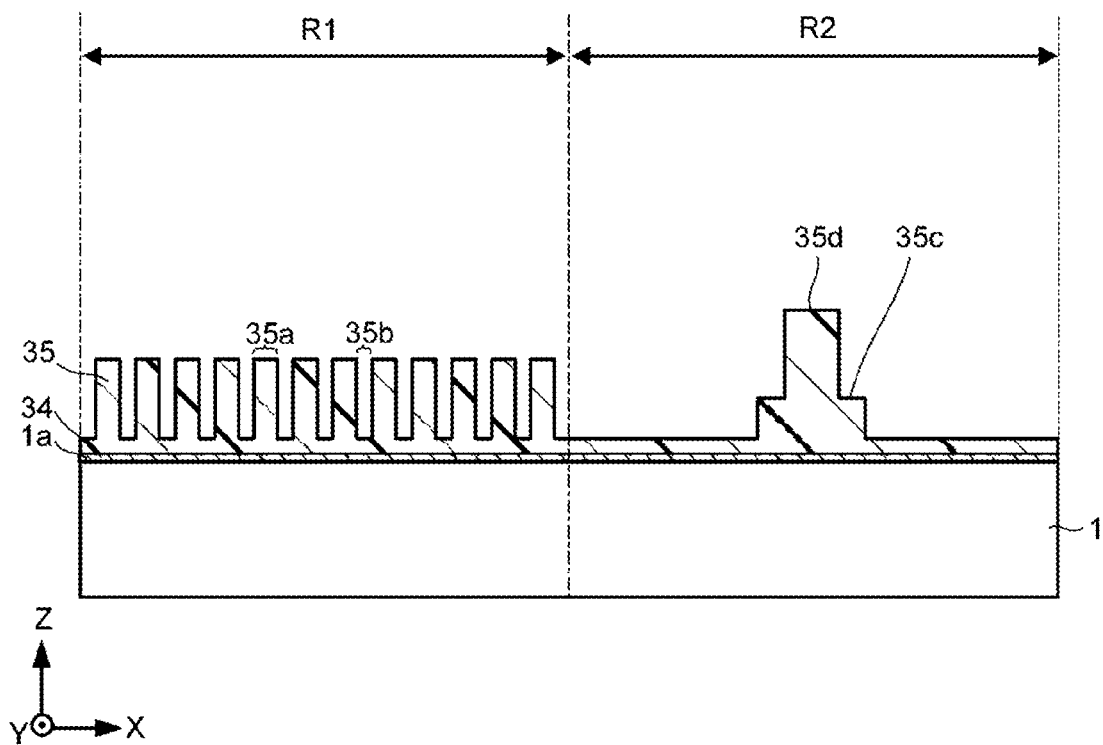

First, as illustrated in FIG. 28, a hard mask layer 34 is formed on the surface 1a, and subsequently, as illustrated in FIG. 29, a resist mask layer 35 is formed on the hard mask layer 34.

The hard mask layer 34 functions as a hard mask for processing the base material 1. The hard mask layer 34 contains, for example, chromium. The hard mask layer 34 may be formed by using, for example, sputtering or an ALD.

The resist mask layer 35 functions as a resist mask for processing the hard mask layer 34. The resist mask layer 35 includes a protrusion portion 35a provided in the region R1, a recess portion 35b provided in the region R1, a protrusion portion 35c provided in the region R2, and a protrusion portion 35d provided in the region R2. The protrusion portion 35a, the protrusion portion 35c, and the protrusion portion 35d are provided in a positions where the hard mask layer 34 will be left. FIG. 29 illustrates an example in which the protrusion portion 35d is higher than the protrusion portion 35c from the surface 1a. The resist mask layer 35 is formed, for example, by using a pattern forming method using NIL.

Figure 30:
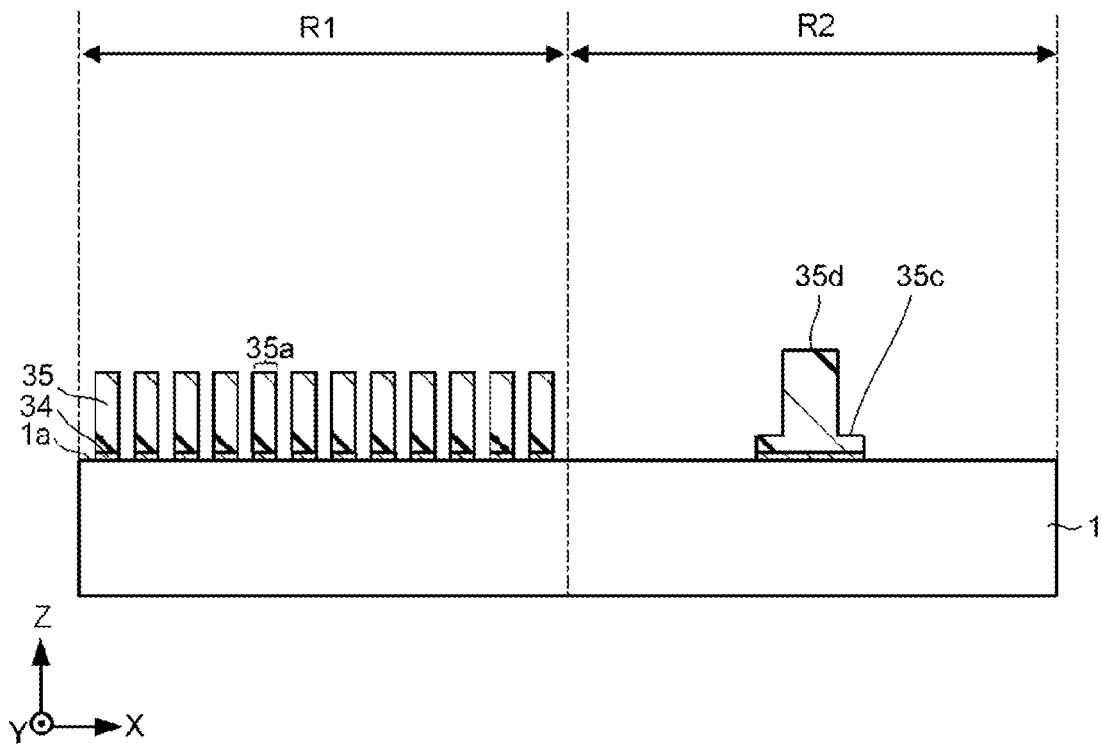

Subsequently, a part of the resist mask layer 35 is removed in the thickness direction to expose a part of the hard mask layer 34, and as illustrated in FIG. 30, the exposed portions of the hard mask layer 34 are removed. The resist mask layer 35 is processed such that the protrusion portion 35a, the protrusion portion 35c, and the protrusion portion 35d still partially remain at this time. The resist mask layer 35 may be partially removed, for example, by reactive ion etching. The hard mask layer 34 may be partially removed, for example, by dry etching. The dry etching that processes the hard mask layer 34 is, for example, inductively coupled plasma-reactive ion etching using a mixed gas of chlorine gas and oxygen gas.

Figure 31:
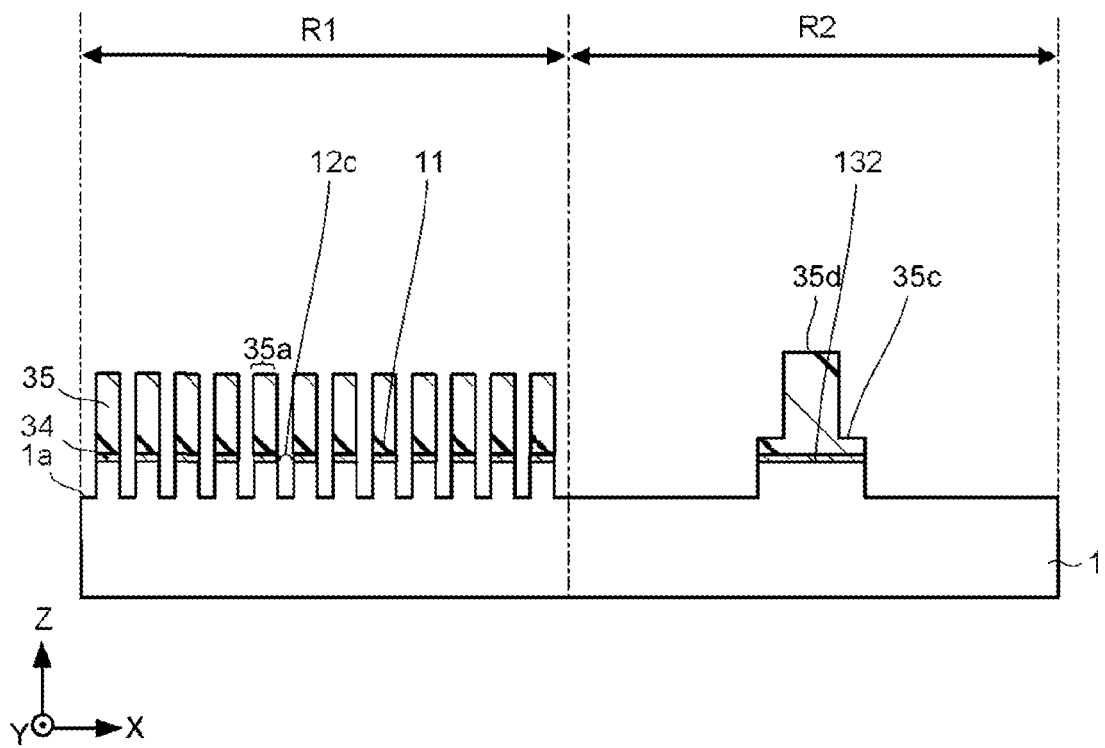

Subsequently, as illustrated in FIG. 31, the base material 1 is partially removed by etching using the combination of the hard mask layer 34 and the resist mask layer 35 as a mask, and thus the protrusion portion 11 and the recess portion 12c are formed in the region R1, and the convex-shaped region 132 is formed in the region R2. The base material 1 is processed, for example, by being partially etched from the surface 1a in the thickness direction of the base material 1, for example, by anisotropic etching such as dry etching. The dry etching that processes the base material 1 is, for example, inductively coupled plasma-reactive ion etching using trifluoromethane gas.

Figure 32:
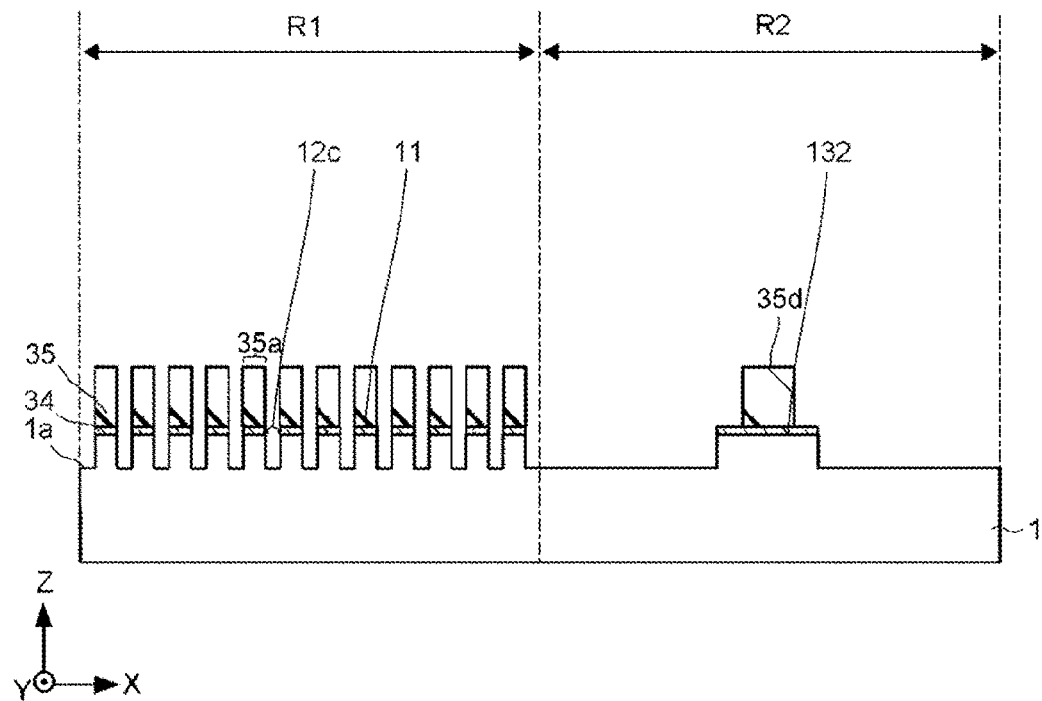

Subsequently, as illustrated in FIG. 32, a part of the resist mask layer 35 is removed in the thickness direction to remove the protrusion portion 35c and to expose a part of the hard mask layer 34. The resist mask layer 35 is processed such that the protrusion portion 35c is removed but the protrusion portion 35a and the protrusion portion 35d still partially remain.

Figure 33:
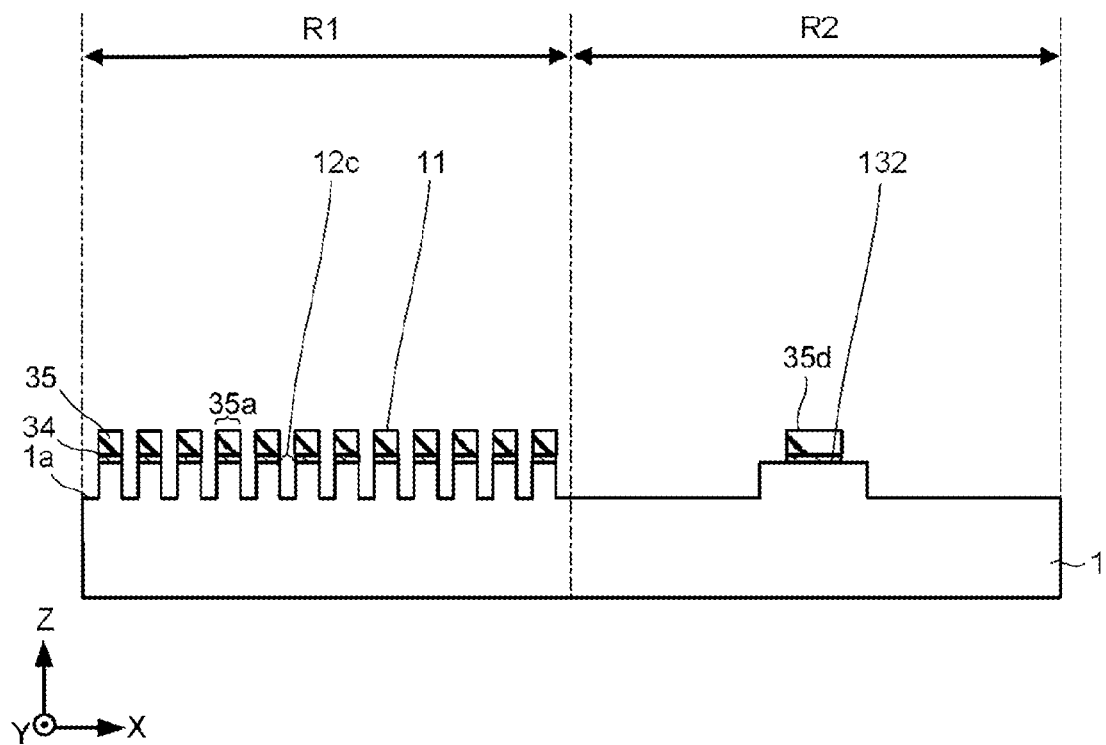

Subsequently, as illustrated in FIG. 33, the newly exposed portion of the hard mask layer 34 is removed by etching using the still remaining resist mask layer 35 as a mask.

Figure 34:
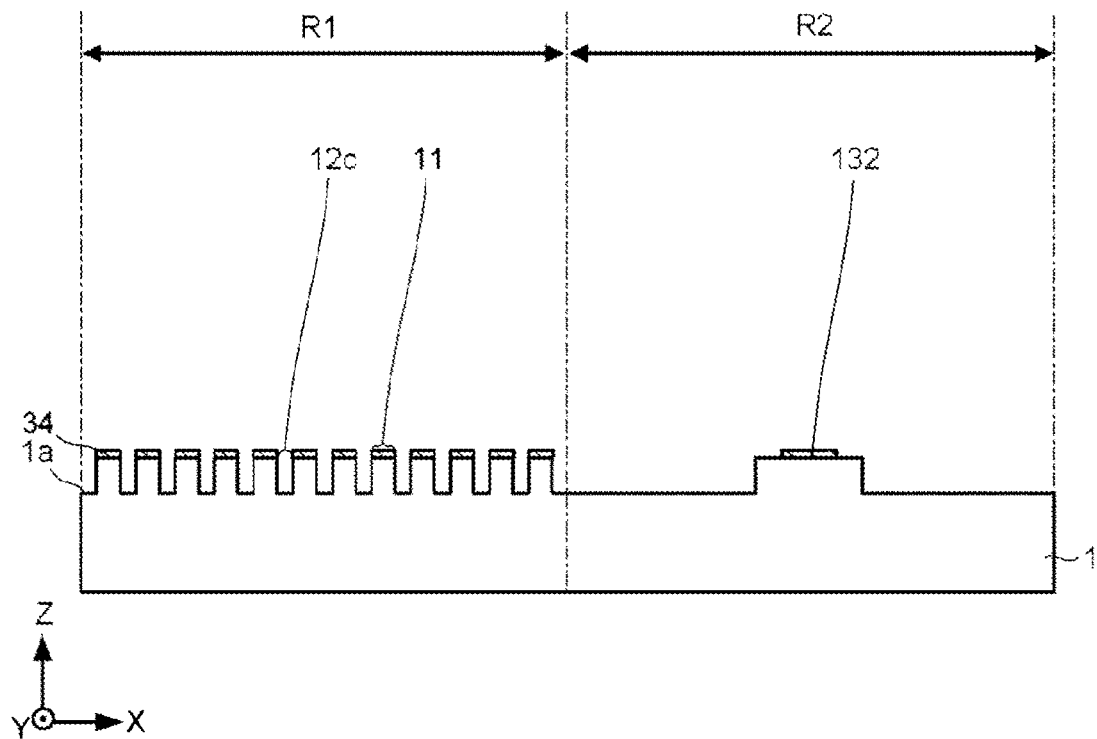
Figure 35:
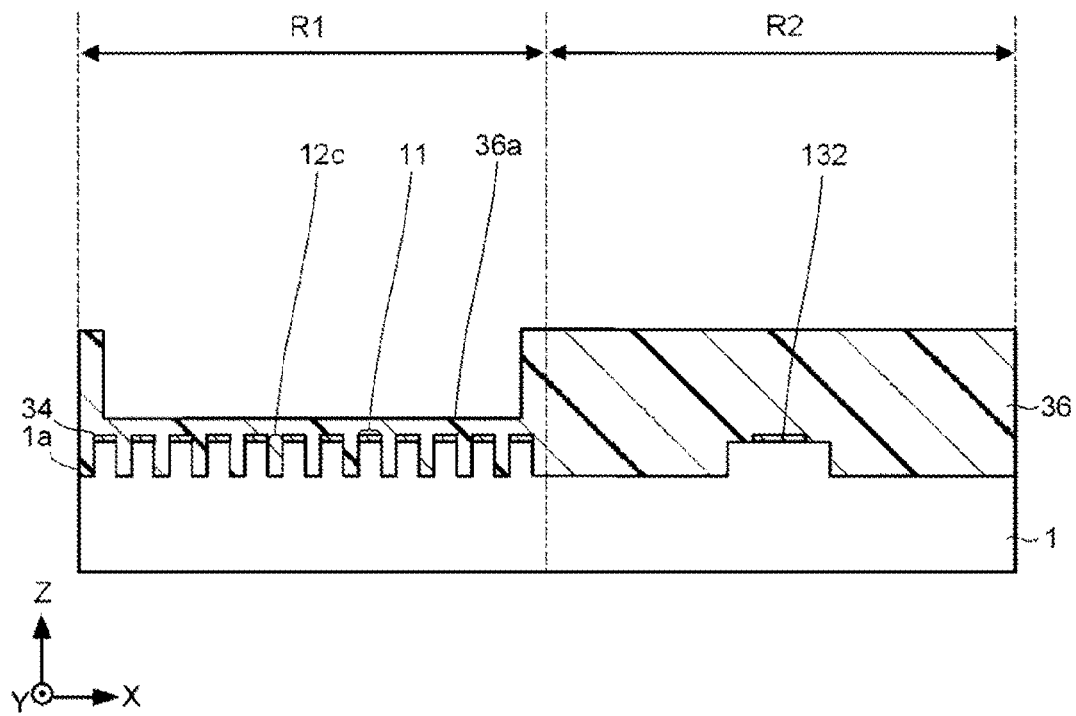

Subsequently, as illustrated in FIG. 34, the resist mask layer 35 is completely removed. Thereafter, as illustrated in FIG. 35, a resist mask layer 36 that covers the protrusion portion 11, the recess portion 12c, and the convex-shaped region 132 is formed. The resist mask layer 36 functions as a resist mask for processing the base material 1. The resist mask layer 36 includes the recess portion 36a at a position overlapping the protrusion portions 11 and the recess portions 12c. The resist mask layer 36 is formed, for example, by using a pattern forming method using NIL.

Figure 36:
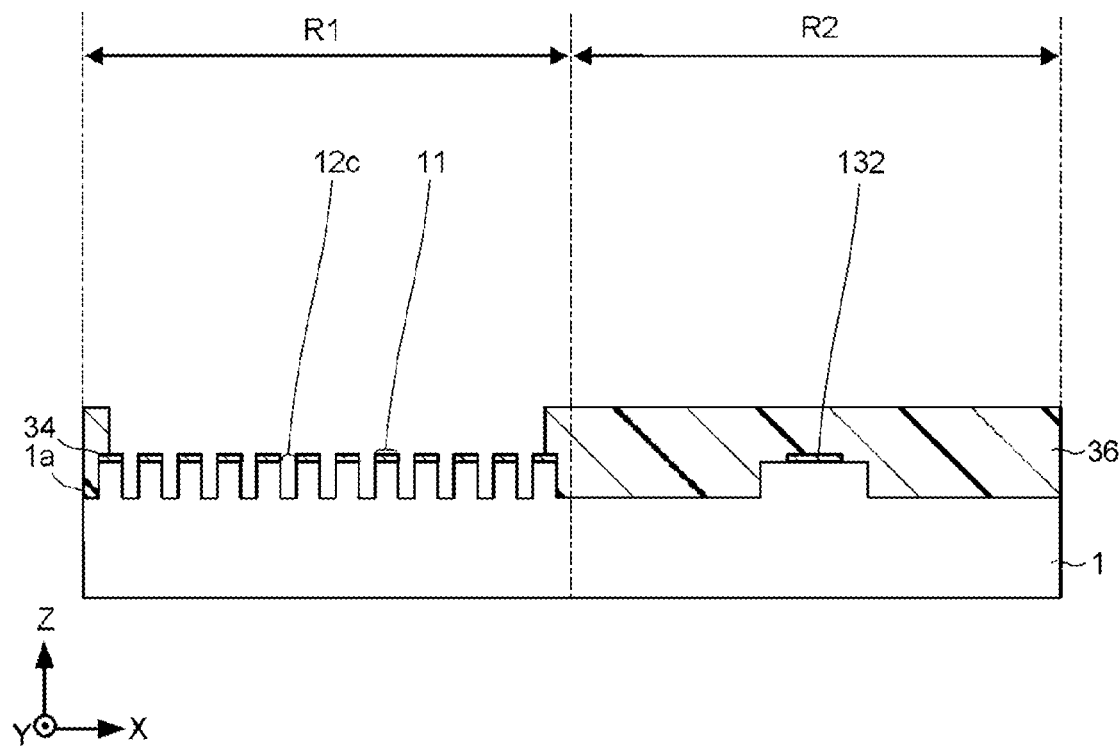

Subsequently, as illustrated in FIG. 36, a part of the resist mask layer 36 is removed to expose a part of the hard mask layer 34 in the region R1 on the protrusion portions 11. The resist mask layer 36 may be partially removed, for example, by reactive ion etching.

Figure 37:
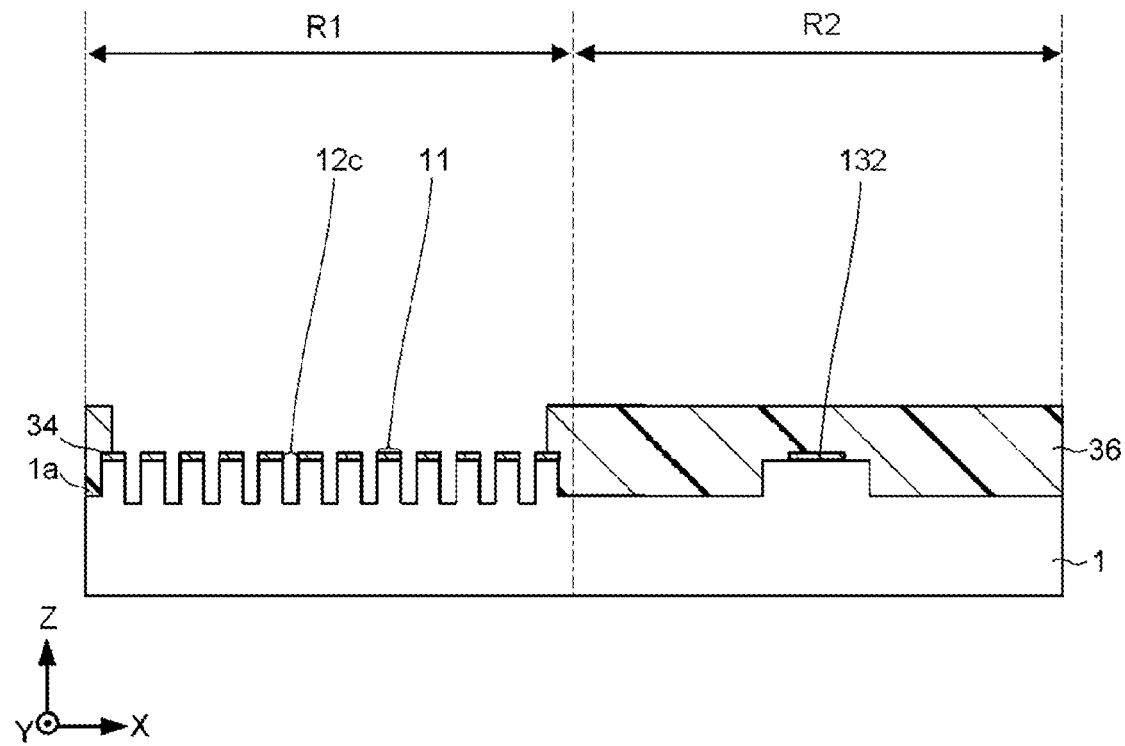

Subsequently, as illustrated in FIG. 37, the base material 1 is partially removed in the thickness direction by etching using the combination of the hard mask layer 34 and the resist mask layer 36 as a mask. Therefore, while the protrusion portion 11 and the convex-shaped region 132 are protected, the recess portion 12c is processed to a position below the level of the surface 1a. That is, the recess portions 12c are etched deeper into the base material 1 such that the bottom of the recess portions 12c are deeper into the base material 1 than the level of the surface 1a in positions outside the recess portions 12c.

Figure 38:
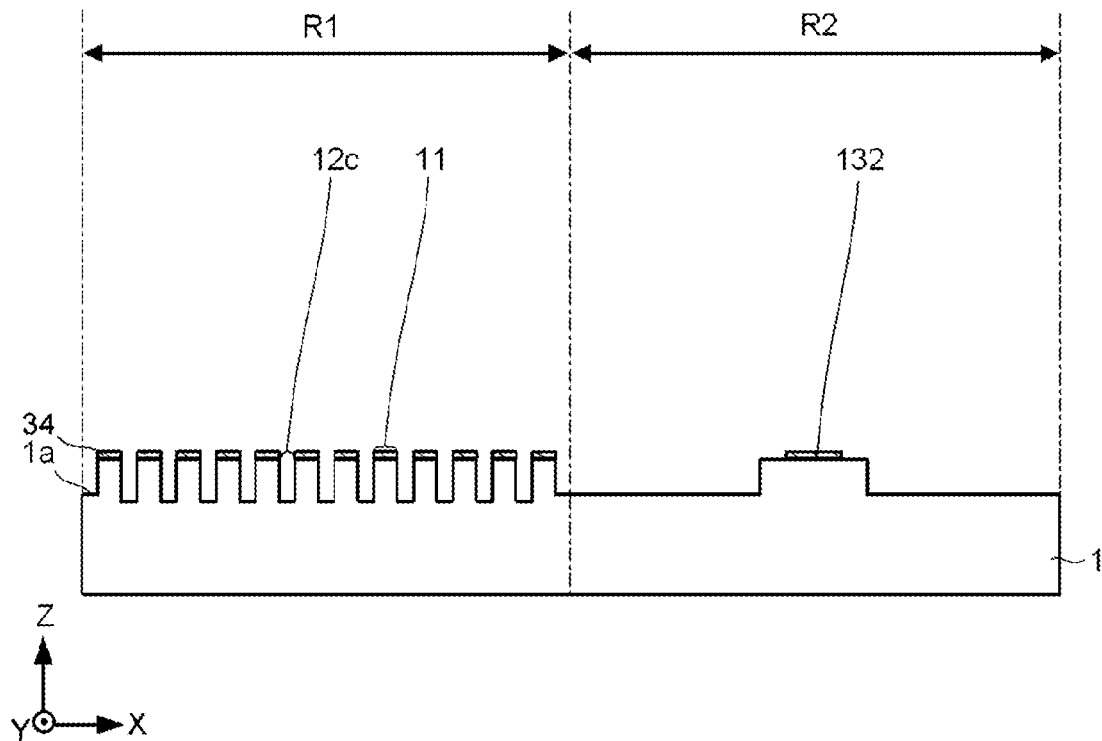
Figure 39:
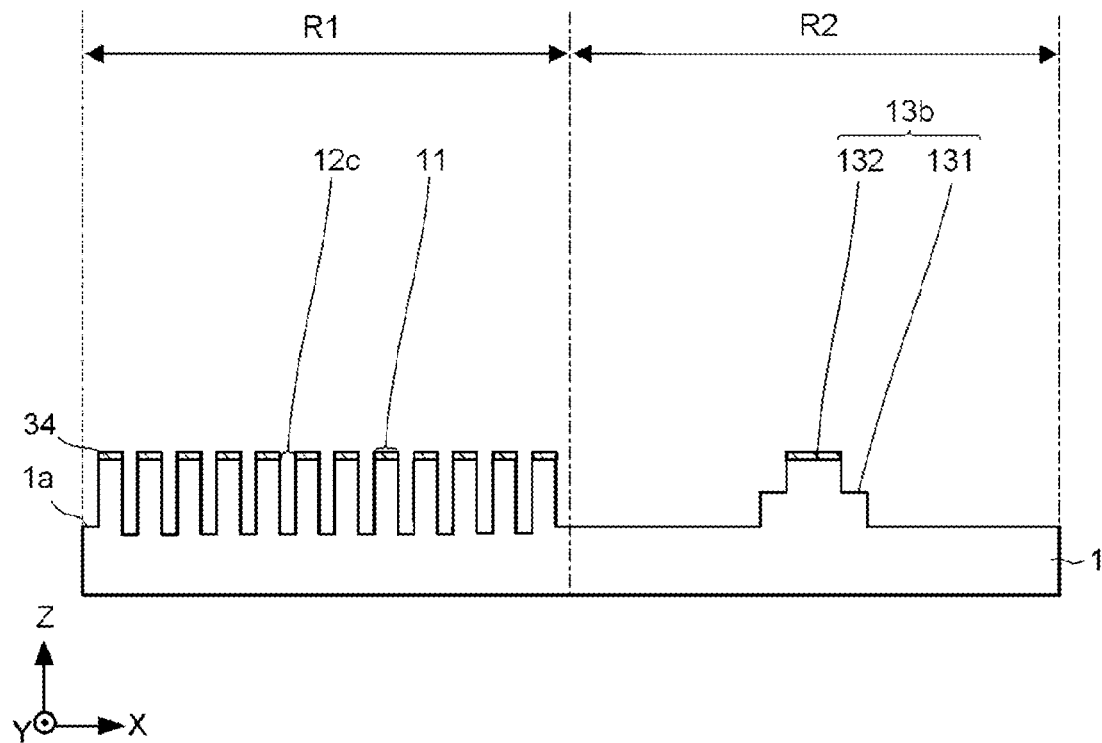

Subsequently, as illustrate in FIG. 38, the resist mask layer 36 is removed. Thereafter, as illustrated in FIG. 39, the base material 1 is partially removed in the thickness direction by etching using the hard mask layer 34 as a mask. Therefore, while the protrusion portion 11 and a part of the convex-shaped region 132 are protected, the recess portion 12c is further processed into the thickness direction of the base material 1, and another part of the convex-shaped region 132 is processed (etched), and thus, the convex-shaped region 131 is formed.

Figure 40:
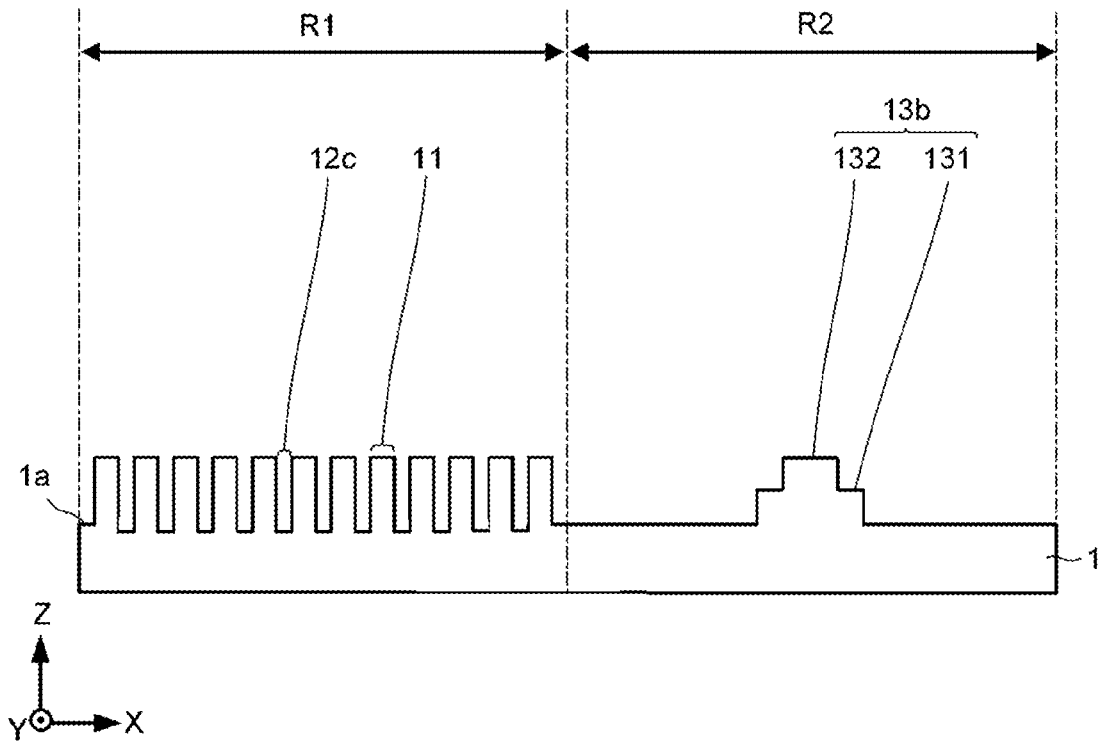
Figure 41:
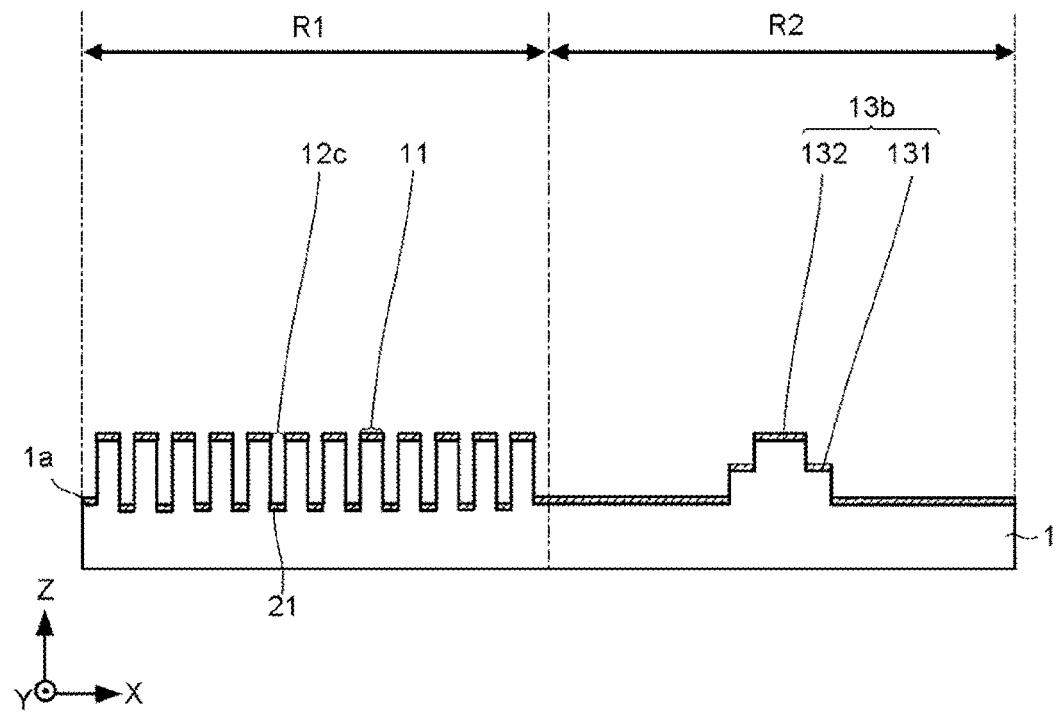

Subsequently, as illustrate in FIG. 40, the hard mask layer 34 is removed. Thereafter, as illustrated in FIG. 41, an optical layer 21 that covers the entire surface 1a is formed. The optical layer 21 is formed by depositing a material on the surface 1a, for example, by reactive sputtering. The optical layer 21 is formed on each of the protrusion portions 11, the recess portions 12c, the convex-shaped region 131, and the convex-shaped region 132.

Figure 42:
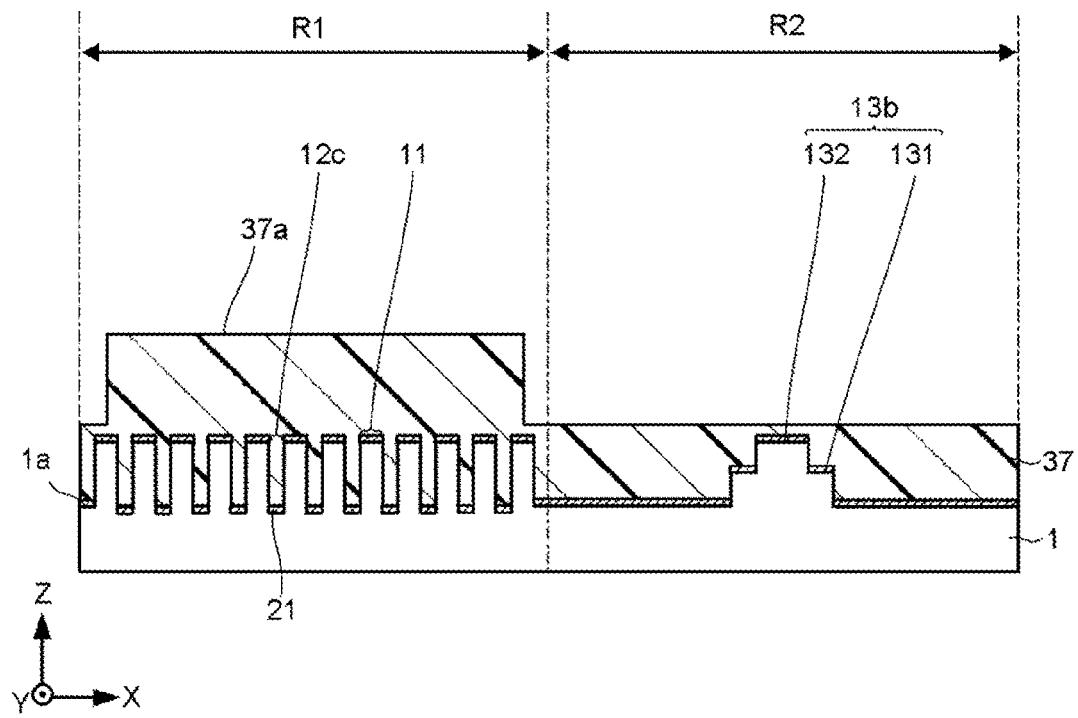

Subsequently, as illustrated in FIG. 42, a resist mask layer 37 is formed on the optical layer 21. The resist mask layer 37 function as a resist mask for processing the optical layer 21. The resist mask layer 37 includes a protrusion portion 37a provided above the recess portions 12c. The protrusion portion 37a is provided in a portion where the optical layer 21 is to be left later. The resist mask layer 37 is formed, for example, by using a pattern forming method using NIL.

Figure 43:
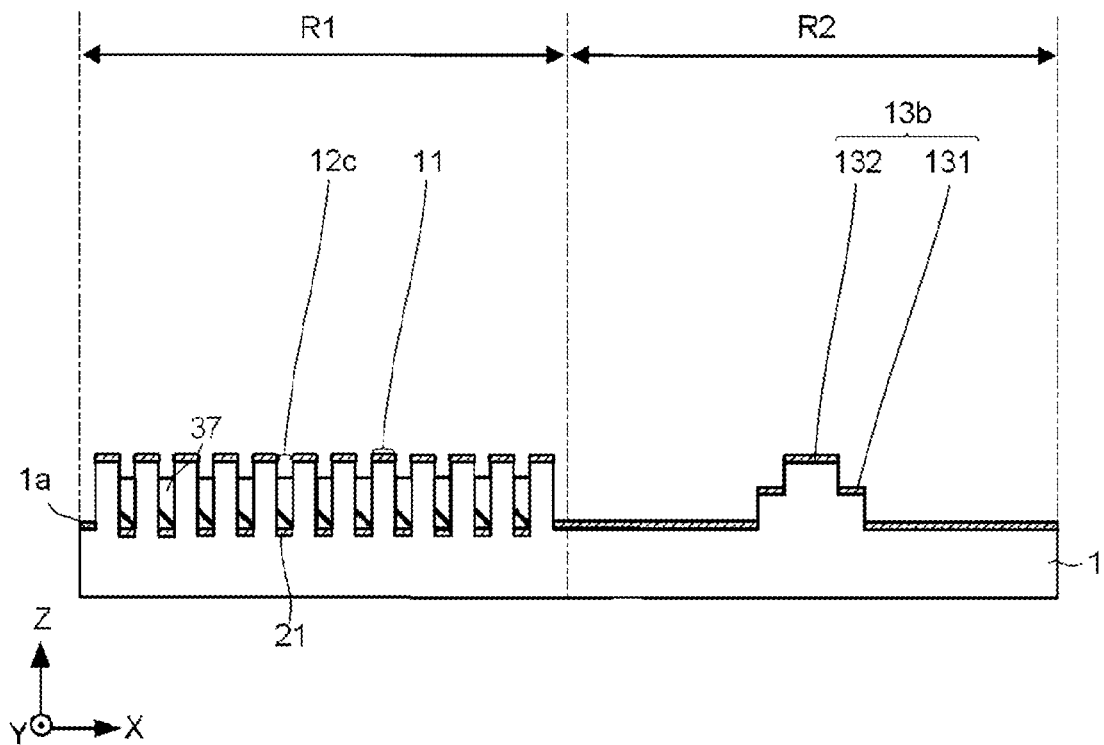

Subsequently, as illustrated in FIG. 43, a part of the resist mask layer 37 is removed in the thickness direction to expose some parts of the optical layer 21 while leaving the resist mask layer 37 in the recess portion 12c.

Figure 44:
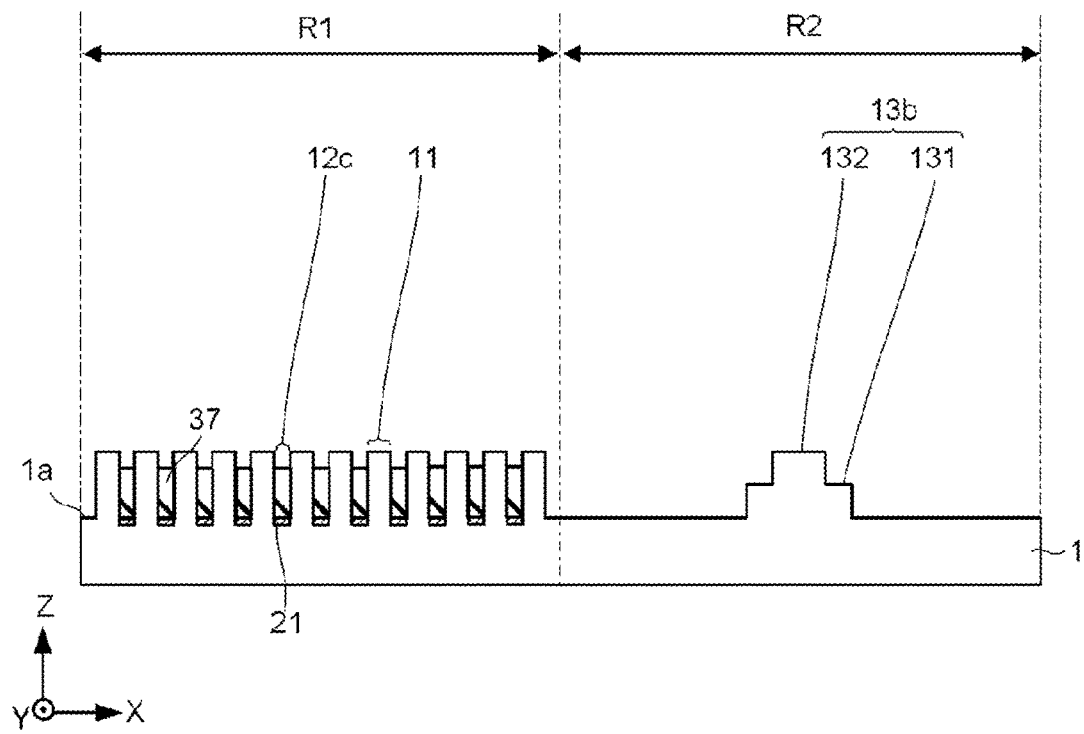

Subsequently, as illustrated in FIG. 44, the exposed portions of the optical layer 21 are removed by etching using the resist mask layer 37 as a mask, and the protrusion portion 11, the convex-shaped region 131, and the convex-shaped region 132 are exposed.

Figure 45:
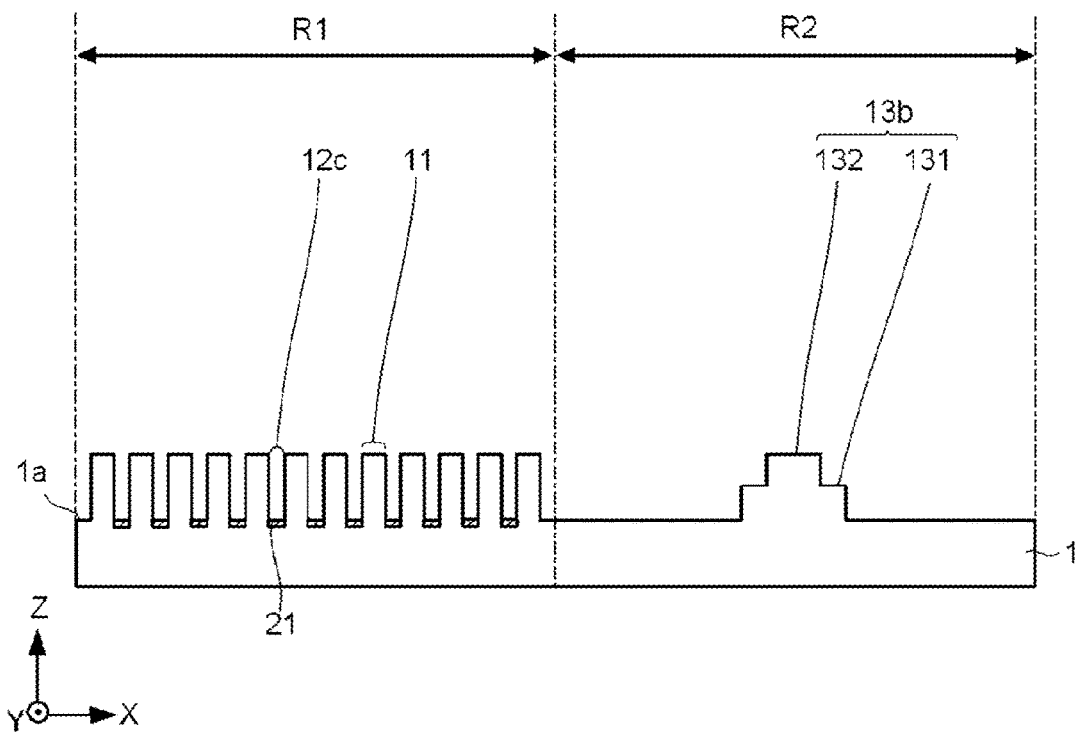

Subsequently, as illustrated in FIG. 45, the resist mask layer 37 is removed. The above is the description of an example of a method for manufacturing the template of the second embodiment.

In the template of the second embodiment, by forming the upper surface 211 of the optical layer 21 to be substantially level with the surface 1a, a pattern can be transferred to the imprint material layer by NIL using the template including the alignment mark pattern AM, and it is possible to form an alignment mark capable of high-precision alignment without violating a design rule related to template feature height (depth) variations, limits, or the like when forming the alignment mark using a transferred or imprinted pattern.

Figure 46:
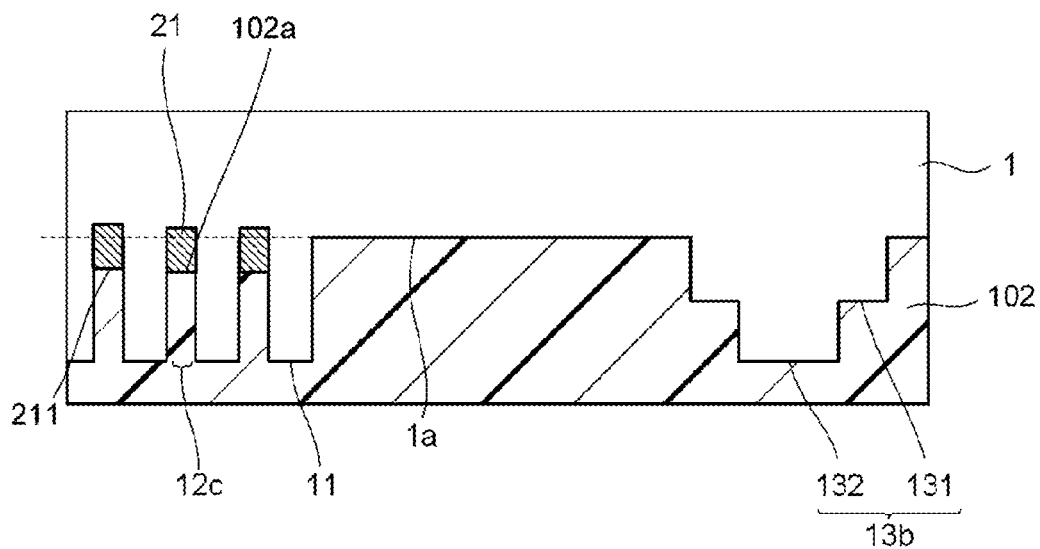
FIG. 46 is a schematic view illustrating a difference in a shape of an imprint material layer due to a difference in a shape of an optical layer.
Figure 47:
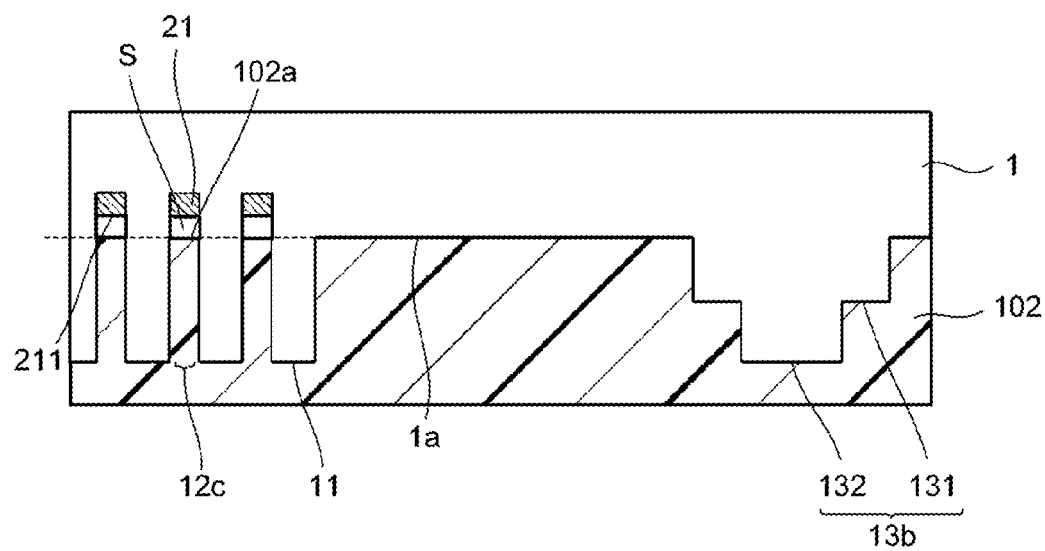
FIG. 47 is a schematic view illustrating a difference in a shape of an imprint material layer due to a difference in a shape of an optical layer.

FIGS. 46 and 47 are schematic views illustrating a difference in a shape of an imprint material layer due to a difference in a shape of the optical layer 21. When the upper surface 211 of the optical layer 21 is too high relative to the surface 1a level, as illustrated in FIG. 46 (note, template now faces downward), the height of a protrusion portion 102a of a layer 102, which is an imprint material layer formed in the recess portion 12c, becomes lower. In this case, it is difficult to form the alignment mark formed using the transferred pattern including the protrusion portion 102a in a desired shape, and thus, a design rule may be violated. Furthermore, when the upper surface 211 of the optical layer 21 is too low relative to the surface 1a level, as illustrated in FIG. 47, the height of the protrusion portion 102a of the layer 102, which is formed in the recess portion 12c, might also be low (the material of the layer 102 does not successfully fill the recess portion 12c in this example), and thus, a gap S may be left between the protrusion portion 102a and the upper surface 211 of the optical layer 21. In this case, the gap S has an optical characteristic different from both the optical layer 21 and the layer 102, and thus, the precision at the time of alignment may be deteriorated.

The second embodiment may be appropriately combined with other described embodiments.

Third Embodiment (Example of Structure of Template)

Similarly to the template of the second embodiment, a template of a third embodiment is provided with the base material 1 including the surface MS, and the recess portion CO. The surface MS includes the alignment mark pattern AM and the device pattern DP.

Figure 48:
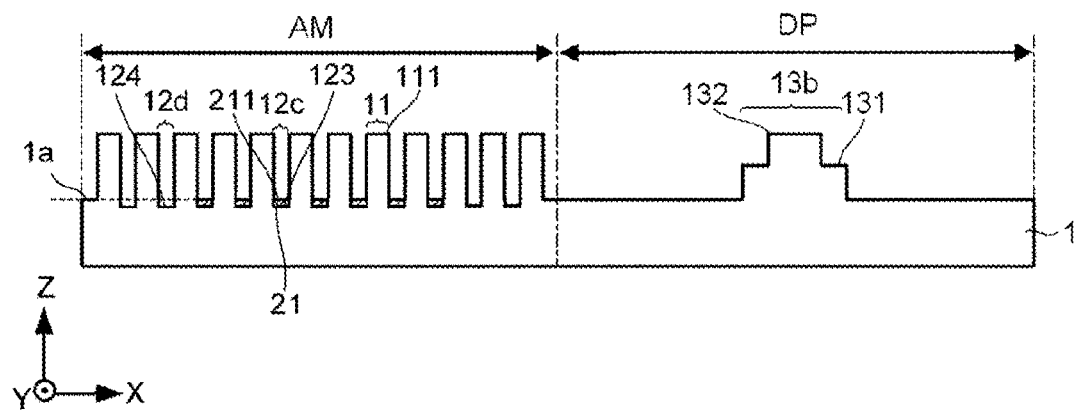
FIG. 48 is a schematic cross-sectional view illustrating an example of a template of a third embodiment.

FIG. 48 is a schematic cross-sectional view illustrating an example of the template of the third embodiment, and illustrates a part of the X-Z cross section of the template. Similarly to the second embodiment, the example of the template of the third embodiment is provided with the base material 1 and the optical layer 21.

Similarly to the second embodiment, the alignment mark pattern AM includes at least one protrusion portion 11 and at least one recess portion 12c, but additionally includes at least one recess portion 12d.

The protrusion portion 11 and the recess portion 12d are alternately formed, for example, in the X-axis direction. For example, the layouts of the recess portion 12b illustrated in FIGS. 5, 6, and 7 may be applied as an upper surface layout of the recess portion 12d. A bottom surface 124 of the recess portion 12d is provided at a position deeper than the surface 1a.

Similarly to the second embodiment, the device pattern DP includes the protrusion portion 13b.

Similarly to the second embodiment, the alignment mark pattern AM may include the protrusion portion 112 illustrated in FIG. 25 between pluralities of recess portions 12c.

The optical layer 21 is to be provided in the recess portion 12c, but not provided in the recess portion 12d. That is, while the bottom surface 121 of the recess portion 12c can be in contact with the optical layer 21, the bottom surface 124 of the recess portion 12d is not in contact with the optical layer 21, but is an exposed surface. The thickness of the optical layer 21 may be less than the depth of the recess portion 12c. The optical layer 21 may be in contact with a part of the bottom surface 123 of a plurality of recess portions 12c.

Figure 49:
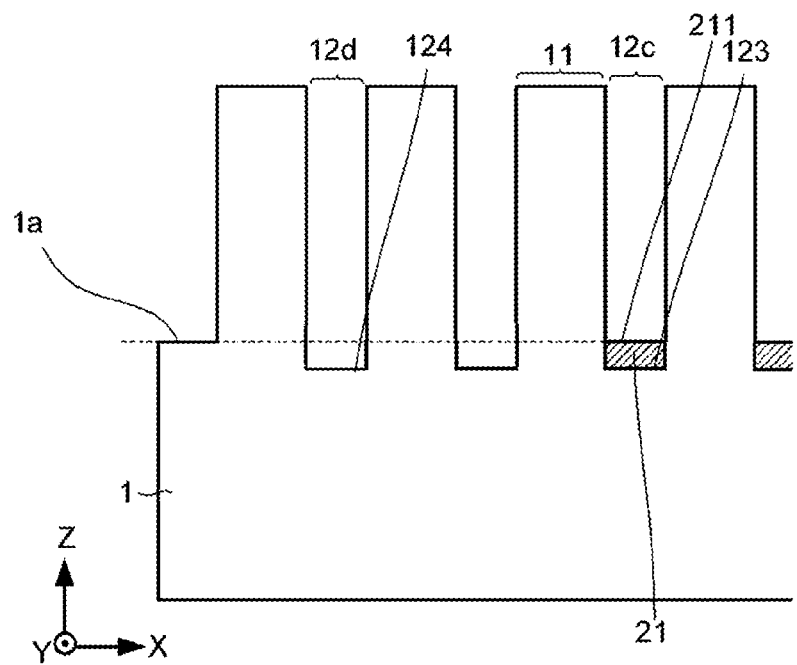
FIG. 49 is a schematic cross-sectional view illustrating an example portion of a template of a third embodiment.

As illustrated in FIG. 49, the upper surface 211 of the optical layer 21 may be substantially level with the surface 1a. FIG. 49 is an enlarged view of a part of FIG. 48.

Similarly to the second embodiment, the optical layer 21 contains the second material having the second optical constant, which is different from the first optical constant, with respect to light from an optical detector.

Similarly to the second embodiment, the alignment mark pattern of the third embodiment may have the example of the shape illustrated in FIG. 27.

(Example of Method for Manufacturing Template)

FIGS. 50 to 53 are schematic cross-sectional views illustrating an example of a method for manufacturing the template of the third embodiment, and illustrate a part of the X-Z cross section of the base material 1. The example of the method for manufacturing the template will be described by schematically illustrating the region R1 of the base material 1 in which the alignment mark pattern AM is formed and the region R2 of the base material 1 in which the device pattern DP is formed.

Excepting that the recess portion 12d is formed by the same process as the recess portion 12c, similarly to the second embodiment, the protrusion portion 11, the recess portion 12c, the protrusion portion 13b, and the optical layer 21 are formed through the processes from FIG. 28 to FIG. 41. The description of the method of forming the recess portion 12c corresponds to the method of forming the recess portion 12d.

Figure 50:
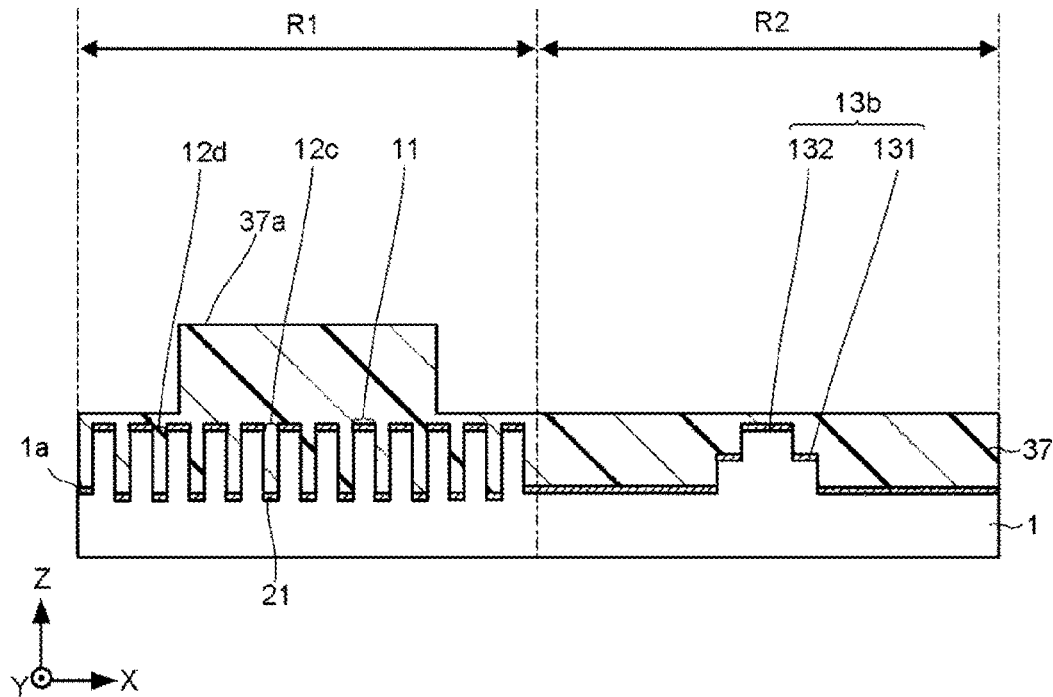
FIGS. 50 to 53 are schematic cross-sectional views illustrating aspects of a method for manufacturing a template of a third embodiment.

As illustrated in FIG. 50, the resist mask layer 37 is formed on the optical layer 21. The resist mask layer 37 functions as a resist mask for processing the optical layer 21. The resist mask layer 37 includes the protrusion portion 37a provided above the recess portions 12c. The protrusion portion 37a is provided in a portion where the optical layer 21 is to be left later. In FIG. 50, the protrusion portion 37a is not overlapping the recess portion 12d in the Z-axis direction. The resist mask layer 37 is formed, for example, by using a pattern forming method using NIL.

Figure 51:
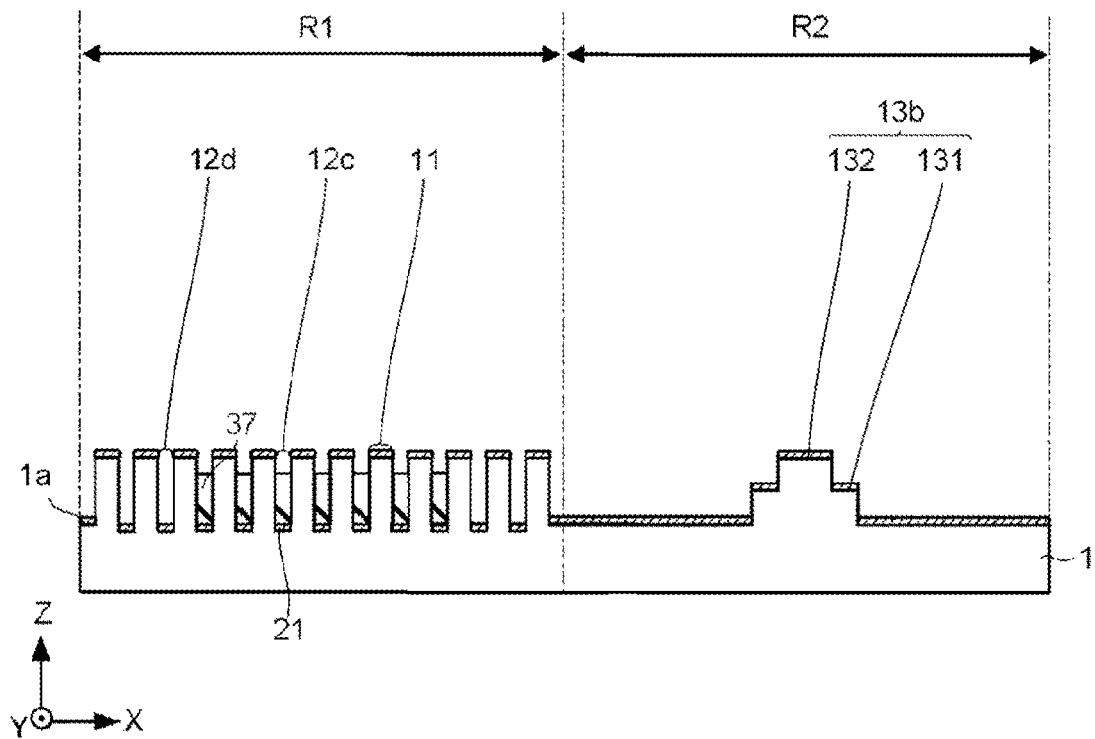

Subsequently, as illustrated in FIG. 51, a part of the resist mask layer 37 is removed to expose parts of the optical layer 21 while leaving the resist mask layer 37 in the recess portions 12c.

Figure 52:
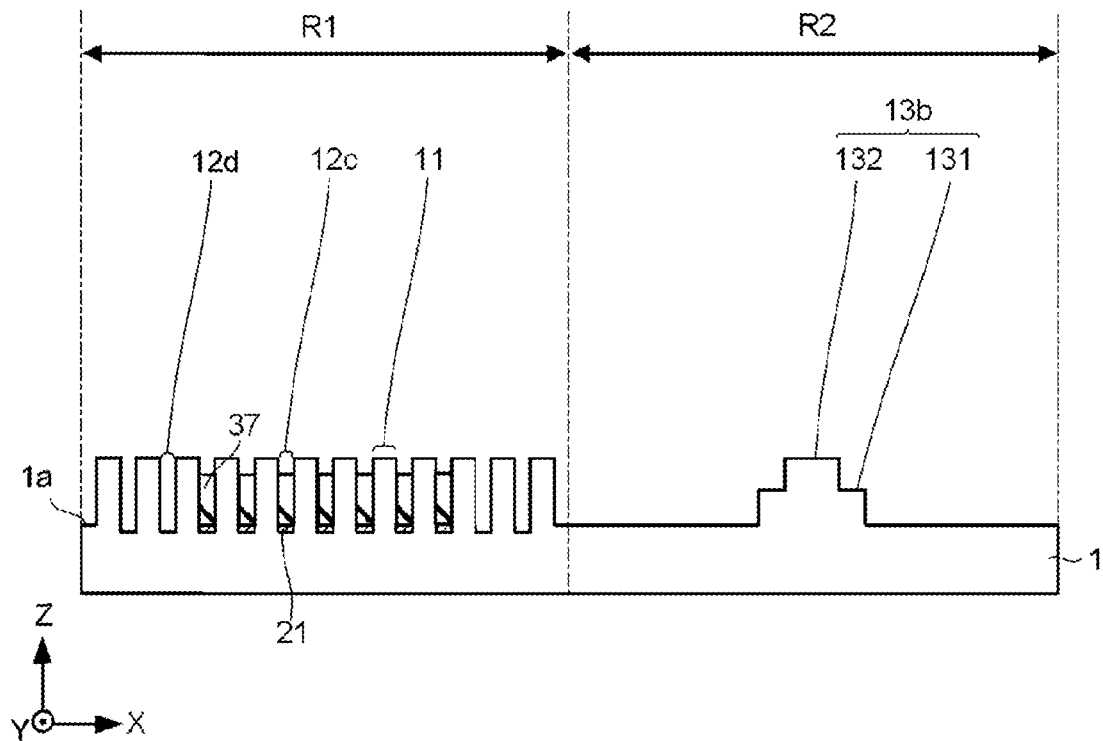

Subsequently, as illustrated in FIG. 52, the exposed portion of the optical layer 21 is removed by etching using the remaining resist mask layer 37 as a mask, and the protrusion portion 11, the convex-shaped region 131, and the convex-shaped region 132 are exposed.

Figure 53:
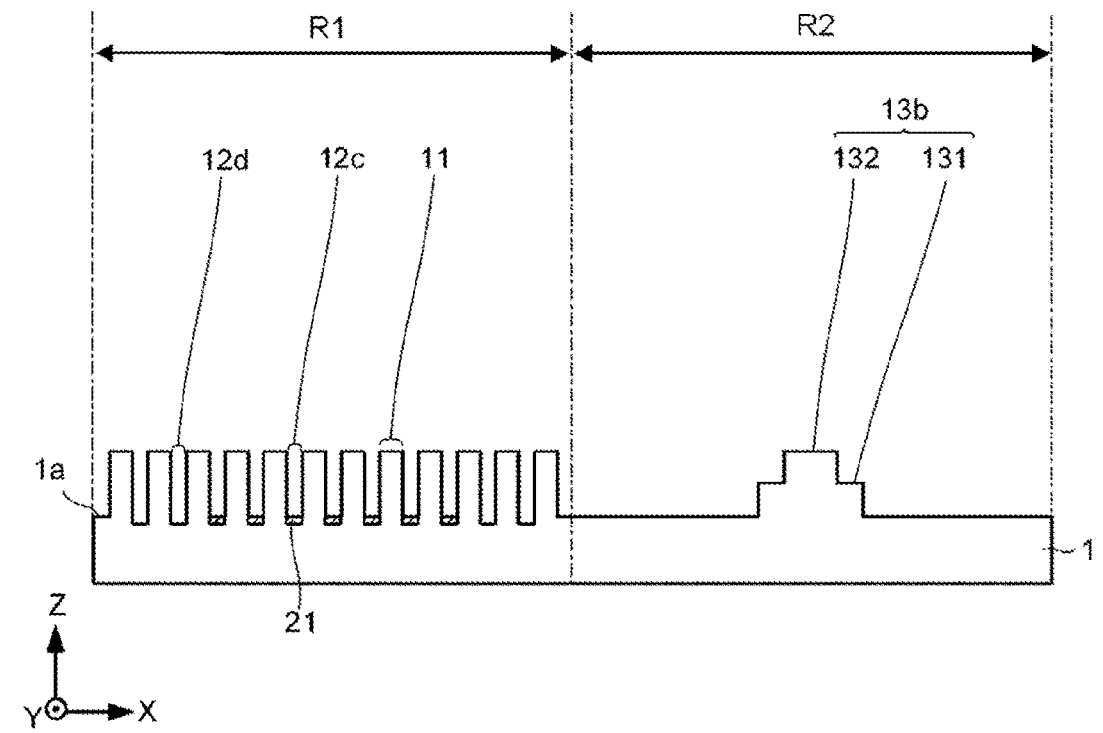

Subsequently, as illustrated in FIG. 53, the resist mask layer 37 is removed. The above is the description of an example of the method for manufacturing the template of the third embodiment.

In the method of manufacturing the template of the third embodiment, the optical layer 21 is not intended to be formed in the recess portion 12d. However, even if the position of the optical layer 21 is displaced such that optical layer 21 is in fact formed in a recess portion 12d (e.g., due to manufacturing tolerances or alignment process limitations), the optical layer 21 may be prevented from entering the edge portion of the alignment mark pattern AM. Therefore, similarly to the first embodiment, an alignment mark capable of high-precision alignment may still be formed.

Further, in the template and the method of manufacturing the template of the third embodiment, similarly to the second embodiment, by forming the upper surface 211 of the optical layer 21 to be substantially level with the surface 1a, a pattern is transferred to the imprint material layer by NIL using the template including the alignment mark pattern AM, and it is possible to form an alignment mark capable of high-precision alignment without violating a design rule when forming the alignment mark using the transferred pattern.

The embodiment may be appropriately combined with other described embodiments.

Fourth Embodiment

FIGS. 54 to 57 are schematic cross-sectional views illustrating an example of a method for manufacturing a semiconductor device using NIL.

Figure 54:
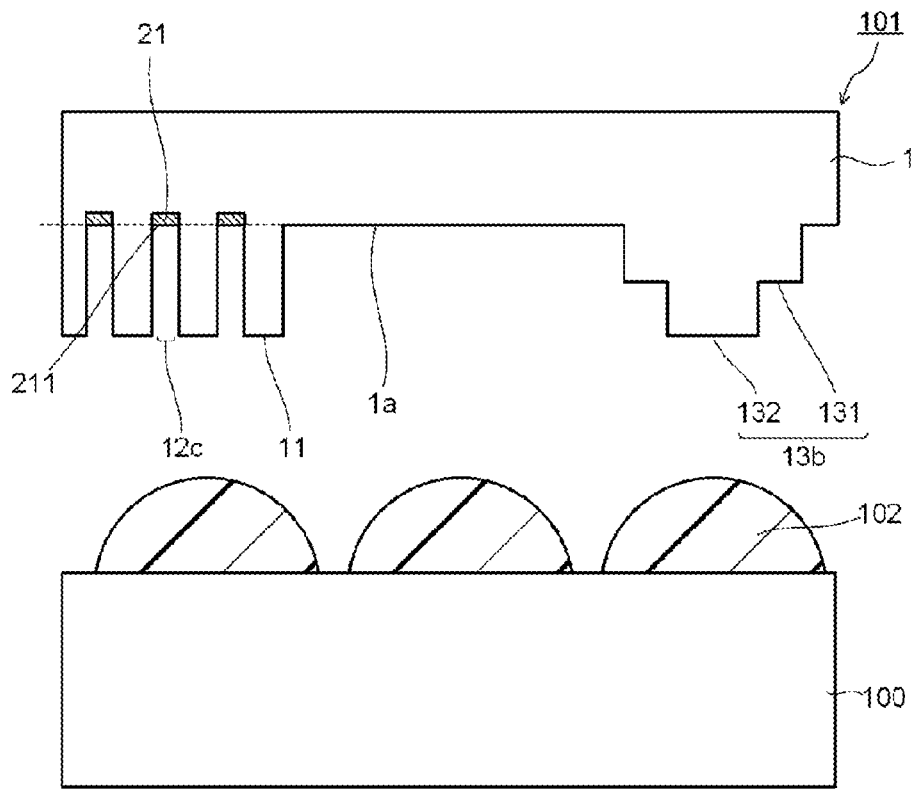
FIGS. 54 to 57 are schematic cross-sectional views illustrating aspects of a method for manufacturing a semiconductor device using NIL.

As illustrated in FIG. 54, the position of the processing surface of an object 100 and the position of the pattern forming surface of a template 101 disposed to face the processing surface are aligned with each other. The positions may be aligned with each other, for example, by adjusting the position of the alignment mark pattern AM of the template 101 relative to the position of the alignment mark pattern provided in the object 100.

The object 100 is, for example, a stacked body formed by stacking a plurality of films on a semiconductor substrate. The configuration of the object 100 is not particularly limited.

The template 101 is a template manufactured by any of the manufacturing methods of the first to third embodiments. As an example, FIG. 54 illustrates the template 101 manufactured by the method for the second embodiment.

The layer 102 is formed by applying the imprint material to the processing surface before or after the alignment between template 101 and object 100. The imprint material contains, for example, a light curable resin. The imprint material is applied, for example, by droplet dispensing or spin-coating.

Figure 55:
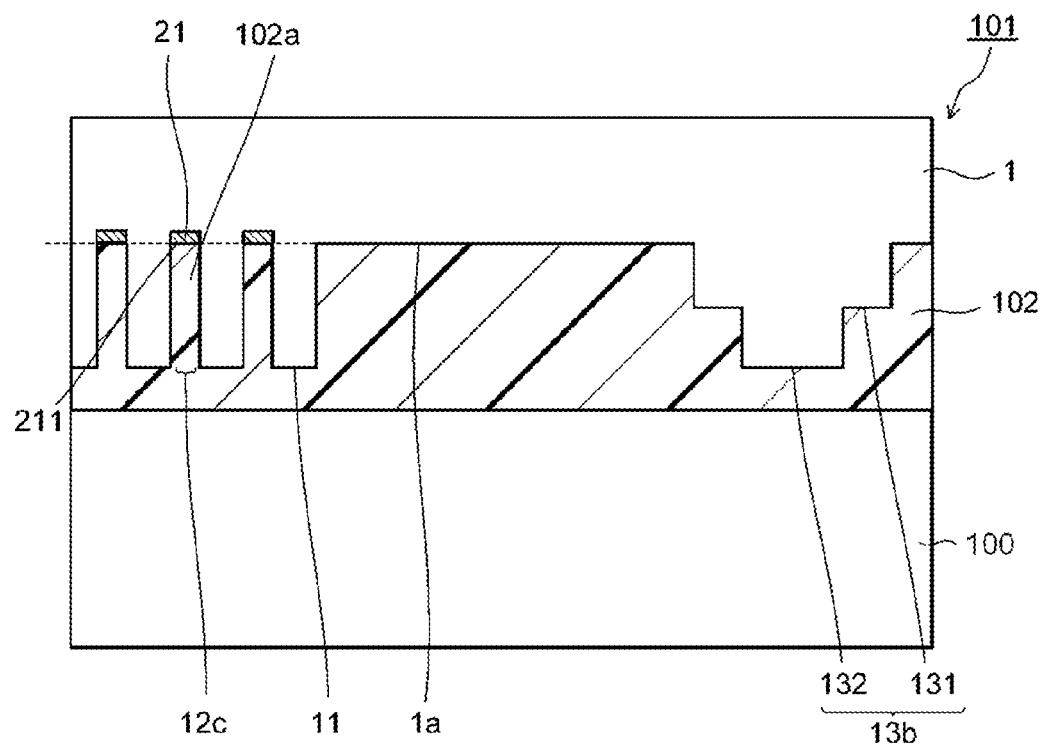

Subsequently, as illustrated in FIG. 55, the template 101 is pressed against the layer 102 to pattern the layer 102, the formed layer 102 is cured while still in contact with the template 101, and the device pattern DP and the alignment mark pattern AM are transferred to the layer 102.

Before curing the layer 102, the object 100 and the template 101 can be precisely aligned while the template 101 is being pressed against the layer 102. When the device pattern DP includes, for example, the convex-shaped region 131 and the convex-shaped region 132, as illustrated in FIG. 55, the cured layer 102 has a pattern for forming a dual damascene structure.

When the layer 102 contains a light curable resin, the layer 102 is cured by being irradiated by light through the template 101. The template 101 is separated from the layer 102 after the layer 102 is cured.

Figure 56:
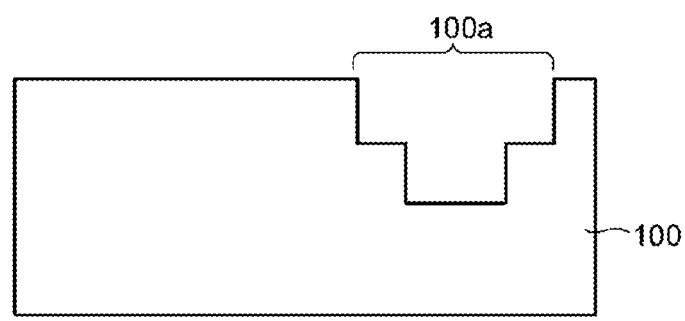

Subsequently, as illustrated in FIG. 56, an opening 100a is formed by processing a part of the object 100 using the layer 102 as mask. The object 100 is processed, for example, by partially removing the stacked layer that constitutes the object 100 by dry etching. The shape of the object 100 after the processing is determined in accordance with the shape of the device pattern DP.

Figure 57:
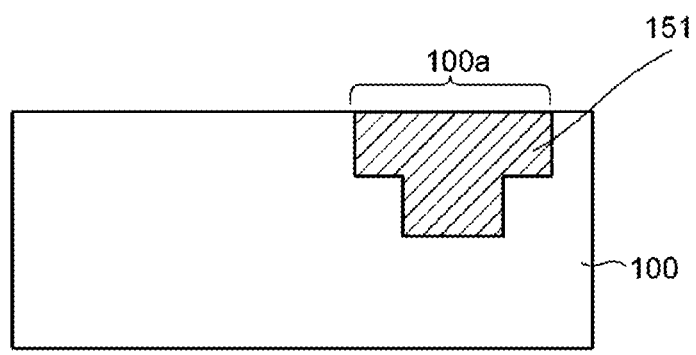

Subsequently, as illustrated in FIG. 57, a film (processing target film) is formed on the object 100, and the film is processed to form a layer 151 in the opening 100a. The layer 151 is, for example, a conductive layer containing a metal material. The layer 151 has a function as, for example, an embedded wiring.

As described above, in a method of manufacturing the semiconductor device, a template manufactured by any of the manufacturing methods for the first to third embodiments can be used to form an applied layer on an object and to transfer a device pattern DP to the object. Therefore, for example, since a semiconductor device may be manufactured, for example, without forming an unnecessary metal layer, deterioration of the performance of the semiconductor device may be prevented.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A template, comprising:
    a base material having a first surface at a first level;
    a first pattern including:
        a plurality of first protruding portions arranged in a fixed periodic manner on the first surface in a first region, each first protruding portion protruding to a second level beyond the first level,
        a first recess portion between an adjacent pair of first protruding portions in a central portion of the first region, and
        a second recess portion between another adjacent pair of first protruding portions in an outer peripheral portion of the first region;
    a second pattern including a protrusion portion on the first surface in a second region different from the first region, the protrusion portion protruding to a third level; and
    an optical layer in the first recess portion, wherein
    at least a portion of a bottom surface of the second recess portion is not covered by the optical layer.

2. The template according to claim 1, wherein the first pattern includes a plurality of first recess portions and a plurality of second recess portions.

3. The template according to claim 2, wherein the first recess portions form a periodic line-space pattern with the first protruding portions.

4. The template according to claim 2, wherein the first recess portions form a grid pattern with the first protruding portions.

5. The template according to claim 2, wherein the first region surrounds the second region.

6. The template according to claim 1, wherein the first pattern is a pattern of an alignment mark.

7. The template according to claim 1, wherein the bottom surface of the second recess portion is at the first level.

8. The template according to claim 1, wherein an upper surface of the optical layer is at the first level.

9. The template according to claim 8, wherein bottom surfaces of the first and second recess portions are at a fourth level further into the base material than the first level.

10. The template according to claim 1, wherein bottom surfaces of the first and second recess portions are at a fourth level further into the base material than the first level.

11. The template according to claim 1, wherein the optical layer is a metal layer.

12. The template according to claim 1, wherein the second level and the third level are at a same height above the first surface.

13. The template according to claim 1, wherein the base material is quartz.

14. The template according to claim 1, wherein the protrusion portion of the second pattern is a multi-level structure including an intermediate portion with an upper surface at a fourth level between the first and third levels.

15. The template according to claim 1, wherein an upper surface of the optical layer is at a fourth level between the first and second levels.

16. The template according to claim 1, wherein a portion of the bottom surface of the second recess is covered by the optical layer.

17. The template according to claim 1, wherein the distance between the adjacent pair of first protruding portions and the distance between the another adjacent pair of first protruding portions is the same.

18. A method for manufacturing a template, the method comprising: patterning a base material substrate having a first surface at a first level to have a first pattern including: a plurality of first protruding portions arranged in a periodic manner on the first surface in a first region, each first protruding portion protruding to a second level beyond the first level, a first recess portion between an adjacent pair of first protruding portions in a central portion of the first region, and a second recess portion between another adjacent pair of first protruding portions in an outer peripheral portion of the first region; and a second pattern including a protrusion portion on the first surface in a second region different from the first region, the protrusion portion protruding to a third level; forming an optical layer in the first and second recess portions; and removing at least a portion of the optical layer to expose at least a portion of a bottom surface of the second recess portion.

19. A method for manufacturing a semiconductor device, the method comprising:
    patterning a resin layer on a device substrate by pressing a template according to claim 1 against a resin material on the device substrate;
    curing the patterned resin layer; and transferring the second pattern to a process layer on the device substrate.

20. The method according to claim 19, wherein an upper surface of the optical layer is at the first level.

* * * * *